(12) United States Patent
Kao et al.

(10) Patent No.: US 11,942,329 B2
(45) Date of Patent: Mar. 26, 2024

(54) FORMATION METHOD OF SEMICONDUCTOR DEVICE WITH DIELECTRIC ISOLATION STRUCTURE

(71) Applicant: Taiwan Semiconductor Manufacturing Company, Ltd., Hsinchu (TW)

(72) Inventors: Wan-Yi Kao, Baoshan Township, Hsinchu County (TW); Che-Hao Chang, Hsinchu (TW); Yung-Cheng Lu, Hsinchu (TW); Chi On Chui, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 203 days.

(21) Appl. No.: 17/685,738

(22) Filed: Mar. 3, 2022

(65) Prior Publication Data

US 2023/0025396 A1    Jan. 26, 2023

Related U.S. Application Data

(60) Provisional application No. 63/225,192, filed on Jul. 23, 2021.

(51) Int. Cl.
*H01L 21/3105* (2006.01)

(52) U.S. Cl.
CPC .............................. *H01L 21/31051* (2013.01)

(58) Field of Classification Search
CPC .................... H01L 21/31051; H01L 21/76224
See application file for complete search history.

(56) References Cited

U.S. PATENT DOCUMENTS

| | | | |
|---|---|---|---|
| 8,836,016 B2 | 9/2014 | Wu et al. |
| 8,841,701 B2 | 9/2014 | Lin et al. |
| 8,847,293 B2 | 9/2014 | Lee et al. |
| 8,853,025 B2 | 10/2014 | Zhang et al. |
| 8,962,400 B2 | 2/2015 | Tsai et al. |
| 9,093,514 B2 | 7/2015 | Tsai et al. |
| 9,236,267 B2 | 1/2016 | De et al. |
| 9,245,805 B2 | 1/2016 | Yeh et al. |
| 9,520,482 B1 | 12/2016 | Chang et al. |
| 9,576,814 B2 | 2/2017 | Wu et al. |

(Continued)

*Primary Examiner* — Binh X Tran
(74) *Attorney, Agent, or Firm* — Birch, Stewart, Kolasch & Birch, LLP

(57) ABSTRACT

A method for forming a semiconductor device is provided. The method includes forming a semiconductor protruding structure over a substrate and surrounding the semiconductor protruding structure with an insulating layer. The method also includes forming a dielectric layer over the insulating layer. The method further includes partially removing the dielectric layer and insulating layer using a planarization process. As a result, topmost surfaces of the semiconductor protruding structure, the insulating layer, and the dielectric layer are substantially level with each other. In addition, the method includes forming a protective layer to cover the topmost surfaces of the dielectric layer. The method includes recessing the insulating layer after the protective layer is formed such that the semiconductor protruding structure and a portion of the dielectric layer protrude from a top surface of a remaining portion of the insulating layer.

20 Claims, 17 Drawing Sheets

(56) References Cited

U.S. PATENT DOCUMENTS

| | | | |
|---|---|---|---|
| 2021/0257261 A1* | 8/2021 | Chu | H01L 21/31133 |
| 2022/0130971 A1* | 4/2022 | Yang | H01L 27/0886 |
| 2022/0293742 A1* | 9/2022 | Tsai | H01L 29/45 |
| 2022/0301922 A1* | 9/2022 | Huang | H01L 29/66795 |
| 2022/0336459 A1* | 10/2022 | Ho | H01L 21/823418 |

* cited by examiner

FORMATION METHOD OF SEMICONDUCTOR DEVICE WITH DIELECTRIC ISOLATION STRUCTURE

PRIORITY CLAIM AND CROSS-REFERENCE

This application claims the benefit of U.S. Provisional Application No. 63/225,192, filed on Jul. 23, 2021, the entirety of which is incorporated by reference herein.

BACKGROUND

The semiconductor integrated circuit (IC) industry has experienced rapid growth. Technological advances in IC materials and design have produced generations of ICs. Each generation has smaller and more complex circuits than the previous generation.

Over the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, these advances have increased the complexity of processing and manufacturing ICs. Since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
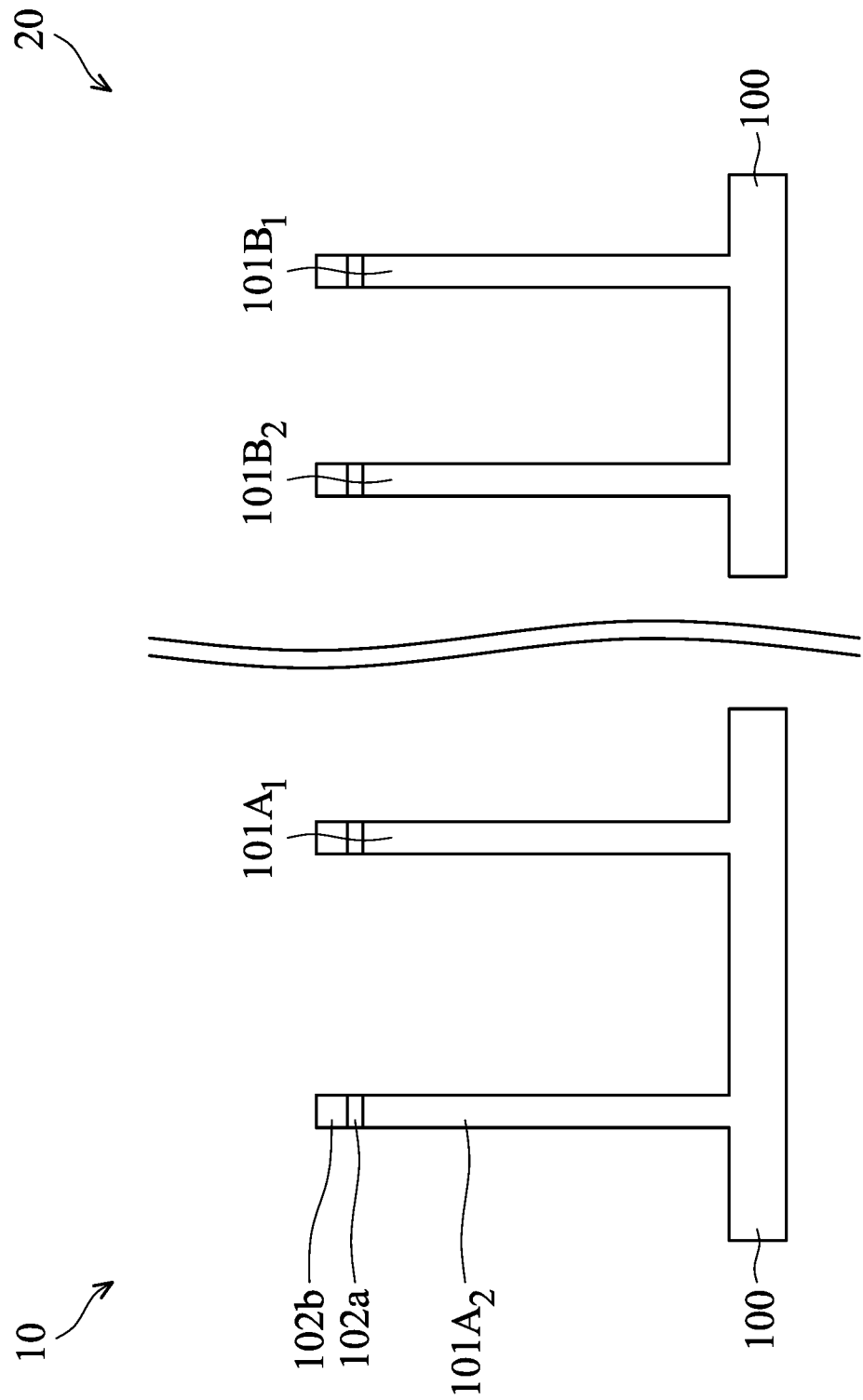
FIGS. 1A-1G are cross-sectional views of various stages of a process for forming a portion of a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. Where applicable, the term "substantially" may also relate to 90% or higher, such as 95% or higher, especially 99% or higher, including 100%. Furthermore, terms such as "substantially parallel" or "substantially perpendicular" are to be interpreted as not to exclude insignificant deviation from the specified arrangement and may include for example deviations of up to 10°. The word "substantially" does not exclude "completely" e.g. a composition which is "substantially free" from Y may be completely free from Y.

Terms such as "about" in conjunction with a specific distance or size are to be interpreted so as not to exclude insignificant deviation from the specified distance or size and may include for example deviations of up to 10%. The term "about" in relation to a numerical value x may mean x ±5 or 10%.

Embodiments of the disclosure may relate to FinFET structure having fins. The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. However, the fins may be formed using one or more other applicable processes.

Embodiments of the disclosure may relate to the gate all around (GAA) transistor structures. The GAA structure may be patterned using any suitable method. For example, the structures may be patterned using one or more photolithography processes, including double-patterning or multi-patterning processes. In some embodiments, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

FIGS. 1A-1G are cross-sectional views of various stages of a process for forming a semiconductor device structure, in accordance with some embodiments. As shown in FIG. 1A, a semiconductor substrate 100 is received or provided. The semiconductor substrate 100 includes regions 10 and 20. In some embodiments, the regions 10 and 20 are designed for forming different devices. In some embodiments, the region 10 is designed for forming logic devices. In some embodiments, input/output (TO) devices are to be formed over the region 10. In some embodiments, the region 20 is designed for forming memory devices. In some embodiments, static random access memory (SRAM) devices are to be formed over the region 20.

In some embodiments, the semiconductor substrate 100 is a bulk semiconductor substrate, such as a semiconductor wafer. For example, the semiconductor substrate 100 includes silicon or other elementary semiconductor materials such as germanium. The semiconductor substrate 100 may be un-doped or doped (e.g., p-type, n-type, or a combination thereof). In some embodiments, the semiconductor substrate 100 includes an epitaxially grown semiconductor layer on a dielectric layer. The epitaxially grown semiconductor layer may be made of silicon germanium, silicon, germanium, one or more other suitable materials, or a combination thereof.

In some other embodiments, the semiconductor substrate 100 includes a compound semiconductor. For example, the compound semiconductor includes one or more III-V compound semiconductors having a composition defined by the formula $Al_{x1}Ga_{x2}In_{x3}As_{y1}P_{y2}N_{y3}Sb_{y4}$, where X1, X2, X3, Y1, Y2, Y3, and Y4 represent relative proportions. Each of them is greater than or equal to zero, and added together they equal 1. The compound semiconductor may include silicon carbide, gallium arsenide, indium arsenide, indium phosphide, one or more other suitable compound semiconductors, or a combination thereof. Another suitable substrate including II-VI compound semiconductors may also be used.

In some embodiments, the semiconductor substrate 100 is an active layer of a semiconductor-on-insulator (SOI) substrate. The SOI substrate may be fabricated using a separation by implantation of oxygen (SIMOX) process, a wafer bonding process, another applicable method, or a combination thereof. In some other embodiments, the semiconductor substrate 100 includes a multi-layered structure. For example, the semiconductor substrate 100 includes a silicon-germanium layer formed on a bulk silicon layer.

As shown in FIG. 1A, multiple semiconductor protruding structures $101A_1$ and $101A_2$ are formed over the region 10, and multiple semiconductor protruding structures $101B_1$ and $101B_2$ are formed over the region 20, in accordance with some embodiments. In some embodiments, the distance between the semiconductor protruding structures $101A_1$ and $101A_2$ is longer than the distance between the semiconductor protruding structures $101B_1$ and $101B_2$. In some embodiments, the semiconductor protruding structures $101A_1$, $101A_2$, $101B_1$, and $101B_2$ are semiconductor fin structures. In some other embodiments, each of the semiconductor fin structures includes a stack of two or more different semiconductor layers that are laid out alternately, which may be used for forming gate-all-around (GAA) devices.

In some embodiments, multiple recesses (or trenches) are formed in the semiconductor substrate 100, in accordance with some embodiments. As a result, multiple semiconductor protruding structures that protrude from the surface of the semiconductor substrate 100 are formed or defined between the recesses. In some embodiments, one or more photolithography and etching processes are used to form the recesses. In some embodiments, the semiconductor protruding structures $101A_1$, $101A_2$, $101B_1$, and $101B_2$ directly connect to the semiconductor substrate 100.

However, embodiments of the disclosure have many variations and/or modifications. In some other embodiments, the semiconductor protruding structures $101A_1$, $101A_2$, $101B_1$, and $101B_2$ are not in direct contact with the semiconductor substrate 100. One or more other material layers may be formed between the semiconductor substrate 100 and the semiconductor protruding structures $101A_1$, $101A_2$, $101B_1$, and $101B_2$. For example, a dielectric layer may be formed therebetween.

In some embodiments, hard mask elements are formed over the semiconductor substrate 100 to assist in the formation of the semiconductor protruding structures $101A_1$, $101A_2$, $101B_1$, and $101B_2$. One or more etching processes may be used to pattern the semiconductor substrate 100 into the semiconductor protruding structures $101A_1$, $101A_2$, $101B_1$, and $101B_2$, as shown in FIG. 1A.

Each of the hard mask elements may include a first mask layer 102a and a second mask layer 102b. The first mask layer 102a and the second mask layer 102b may be made of different materials. In some embodiments, the first mask layer 102a is made of a material that has good adhesion to the semiconductor substrate 100. The first mask layer 102a may be made of silicon oxide, germanium oxide, silicon germanium oxide, one or more other suitable materials, or a combination thereof. In some embodiments, the second mask layer 102b is made of a material that has good etching selectivity to the semiconductor substrate 100. The second mask layer 102b may be made of silicon nitride, silicon oxynitride, silicon carbide, one or more other suitable materials, or a combination thereof.

Figure 1B:
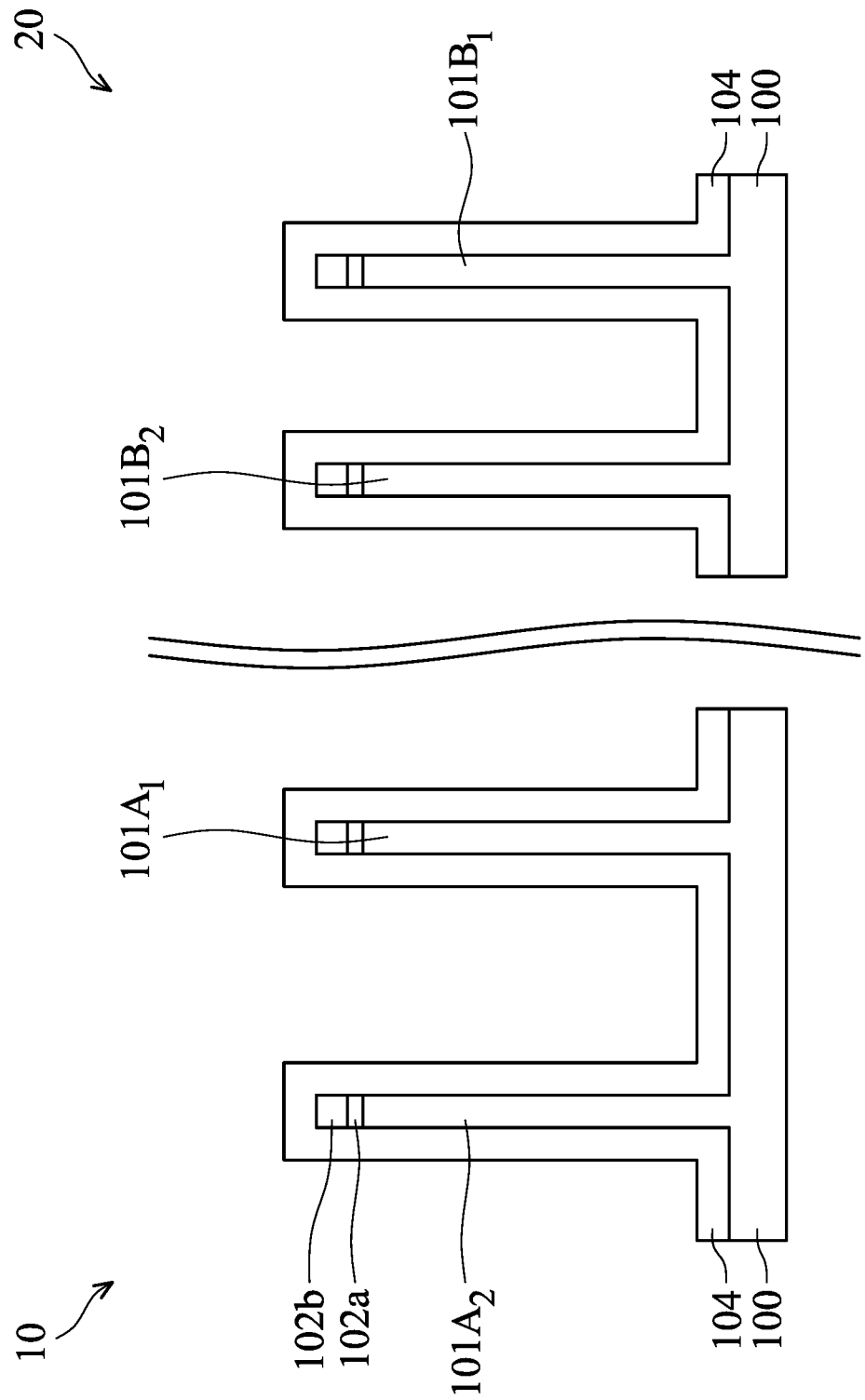

As shown in FIG. 1B, an insulating layer 104 is deposited over the semiconductor substrate 100 and the semiconductor protruding structures $101A_1$-$101A_2$ and $101B_1$-$101B_2$, in accordance with some embodiments. In some embodiments, the insulating layer 104 extends along the tops and the sidewalls of the semiconductor protruding structures $101A_1$, $101A_2$, $101B_1$, and $101B_2$. In some embodiments, the insulating layer 104 conformally extends along the semiconductor protruding structures $101A_1$, $101A_2$, $101B_1$, and $101B_2$.

In some embodiments, the insulating layer 104 is in direct contact with the semiconductor protruding structures 101A$_1$, 101A$_2$, 101B$_1$, and 101B$_2$.

In some embodiments, the insulating layer 104 is made of or includes a dielectric material. The dielectric material may include silicon oxide, carbon-containing silicon oxide, silicon carbide, silicon oxynitride, silicon nitride, one or more other suitable materials, or a combination thereof. In some other embodiments, the insulating layer 104 is substantially free of nitrogen. In these cases, the insulating layer 104 may be made of or include silicon oxide, carbon-containing silicon oxide, silicon carbide, one or more other suitable materials, or a combination thereof.

The insulating layer 104 may be deposited using a chemical vapor deposition (CVD) process, an atomic layer deposition (ALD) process, a thermal oxidation process, a physical vapor deposition (PVD) process, one or more other applicable processes, or a combination thereof. In some embodiments, the insulating layer 104 extends conformally along the sidewalls of the semiconductor protruding structures 101A$_1$-101A$_2$ and 101B$_1$-101B$_2$ and the surface of the semiconductor substrate 100. In these cases, the insulating layer 104 is not deposited using a flowable chemical vapor deposition (FCVD) process.

Figure 1C:
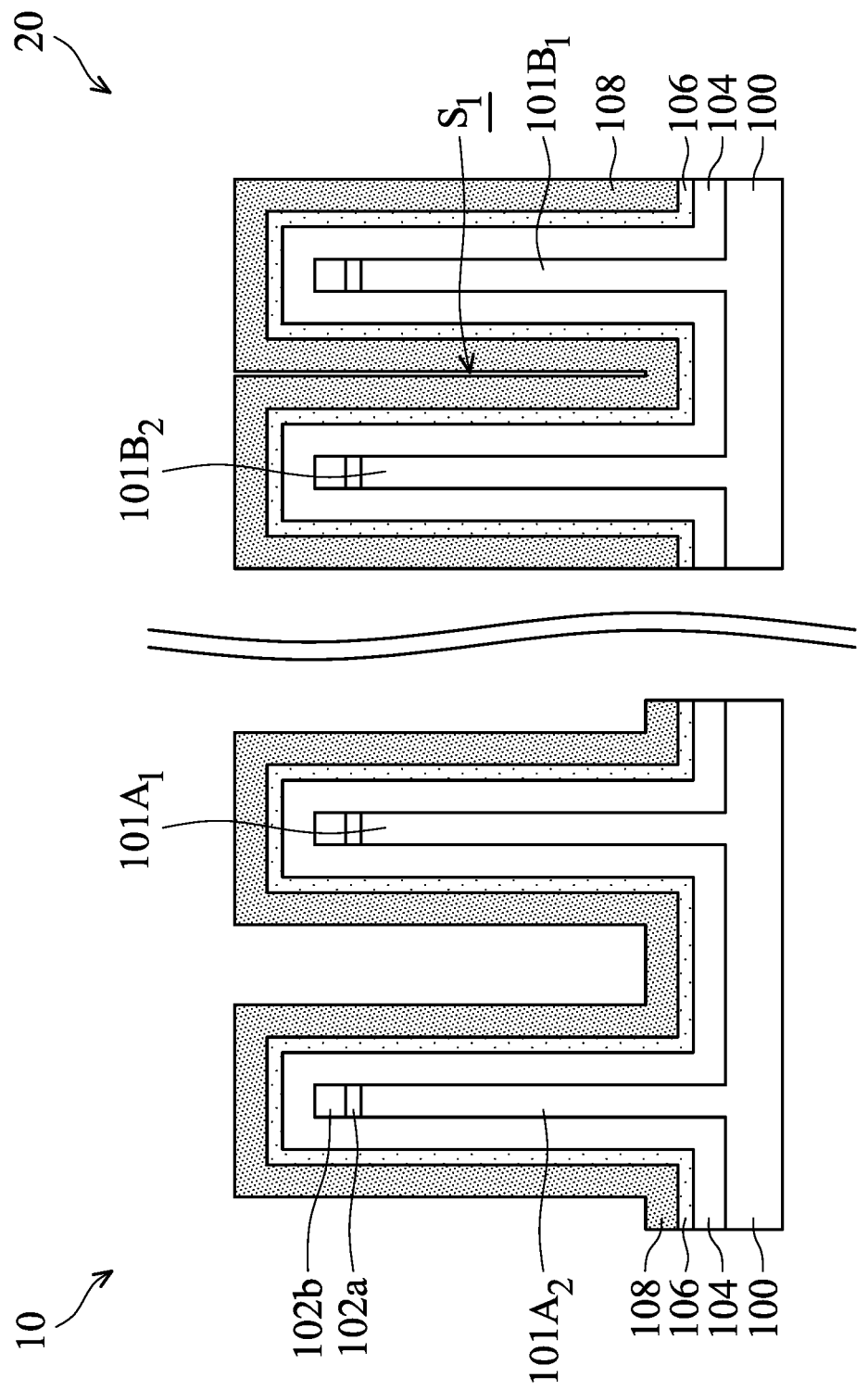

As shown in FIG. 1C, an interfacial layer 106 is deposited over the insulating layer 104, in accordance with some embodiments. In some embodiments, the interfacial layer 106 extends along the sidewalls and the tops of the semiconductor protruding structures 101A$_1$-101A$_2$ and 101B$_1$-101B$_2$. In some embodiments, the interfacial layer 106 conformally extends along the semiconductor protruding structures 101A$_1$-101A$_2$ and 101B$_1$-101B$_2$. In some embodiments, the interfacial layer 106 is in direct contact with the insulating layer 104. In some embodiments, the interfacial layer 106 is thinner than the insulating layer 104.

In some embodiments, the interfacial layer 106 is made of or includes a dielectric material. In some embodiments, the dielectric material contains nitrogen and/or carbon. The dielectric material may include carbon-containing silicon nitride, carbon-containing silicon oxynitride, silicon carbide, silicon oxynitride, silicon nitride, one or more other suitable materials, or a combination thereof. The interfacial layer 106 may be deposited using an ALD process, a CVD process, one or more other applicable processes, or a combination thereof.

Many variations and/or modifications can be made to embodiments of the disclosure. In some other embodiments, the interfacial layer 106 is made of or includes a high dielectric constant (high-k) material. The high-k material may include hafnium oxide, hafnium zirconium oxide, zirconium oxide, hafnium dioxide-alumina alloy, hafnium silicon oxide, hafnium silicon oxynitride, hafnium tantalum oxide, hafnium titanium oxide, lanthanum oxide, hafnium lanthanum oxide, one or more other suitable materials, or a combination thereof. The interfacial layer 106 containing the high-k material may be deposited using an ALD process, a CVD process, one or more other applicable processes, or a combination thereof.

However, embodiments of the disclosure are not limited thereto. Many variations and/or modifications can be made to embodiments of the disclosure. In some other embodiments, the interfacial layer 106 is not formed.

Afterwards, a dielectric layer 108 is deposited over the interfacial layer 106, as shown in FIG. 1C in accordance with some embodiments. In some embodiments, the dielectric layer 108 extends along the sidewalls and the tops of the semiconductor protruding structures 101A$_1$-101A$_2$ and 101B$_1$-101B$_2$. In some embodiments, the dielectric layer 108 conformally extends along the semiconductor protruding structures 101A$_1$-101A$_2$ and 101B$_1$-101B$_2$. In some embodiments, the dielectric layer 108 is in direct contact with the interfacial layer 106. In some embodiments, the dielectric layer 108 is thinner than the interfacial layer 106.

In some embodiments, the dielectric layer 108 is made of or includes a dielectric material. In some embodiments, the dielectric material contains nitrogen and/or carbon. The dielectric material may include carbon-containing silicon nitride, carbon-containing silicon oxynitride, silicon carbide, silicon oxynitride, silicon nitride, one or more other suitable materials, or a combination thereof.

In some embodiments, the dielectric layer 108 is made of carbon-containing silicon nitride (SiCN) with a first atomic concentration of carbon. The interfacial layer 106 is made of carbon-containing silicon nitride (SiCN) with a second atomic concentration of carbon. In some embodiments, the first atomic concentration of carbon is greater than the second atomic concentration of carbon. The first atomic concentration of carbon of the dielectric layer 108 may be in a range from about 15% to about 25%. The second atomic concentration of carbon of the dielectric layer 108 may be in a range from about 5% to about 10%. Due to the different compositions of the dielectric layer 108 and the interfacial layer 106, the etching selectivity of the dielectric layer 108 and the interfacial layer 106 may be different from each other. In some embodiments, the etching rate of the interfacial layer 106 is faster than the dielectric layer 108.

The dielectric layer 108 may be deposited using an ALD process, a CVD process, one or more other applicable processes, or a combination thereof. In some embodiments, the interfacial layer 106 and the dielectric layer 108 are sequentially formed in-situ in the same process chamber. In some embodiments, the vacuum of the process chamber is not broken during the formation of the interfacial layer 106 and the dielectric layer 108.

As shown in FIG. 1C, the trench between the semiconductor protruding structures 101B$_1$ and 101B$_2$ is narrower than the trench between the semiconductor protruding structures 101A$_1$ and 101A$_2$. In some embodiments, the dielectric layer 108 substantially fills the remaining space of the narrower trench between the semiconductor protruding structures 101B$_1$ and 101B$_2$ while the dielectric layer 108 partially fills the trench between the semiconductor protruding structures 101A$_1$ and 101A$_2$. In some embodiments, a seam S$_1$ that is surrounded by the dielectric layer 108 is formed, as shown in FIG. 1C. In some embodiments, the dielectric layer 108 is formed using an ALD process, and the seam S$_1$ is naturally formed due to the characteristics of the ALD process for forming the dielectric layer 108. The width of the seam S$_1$ may be in a range from 10 angstroms to about 50 angstroms.

Figure 1D:
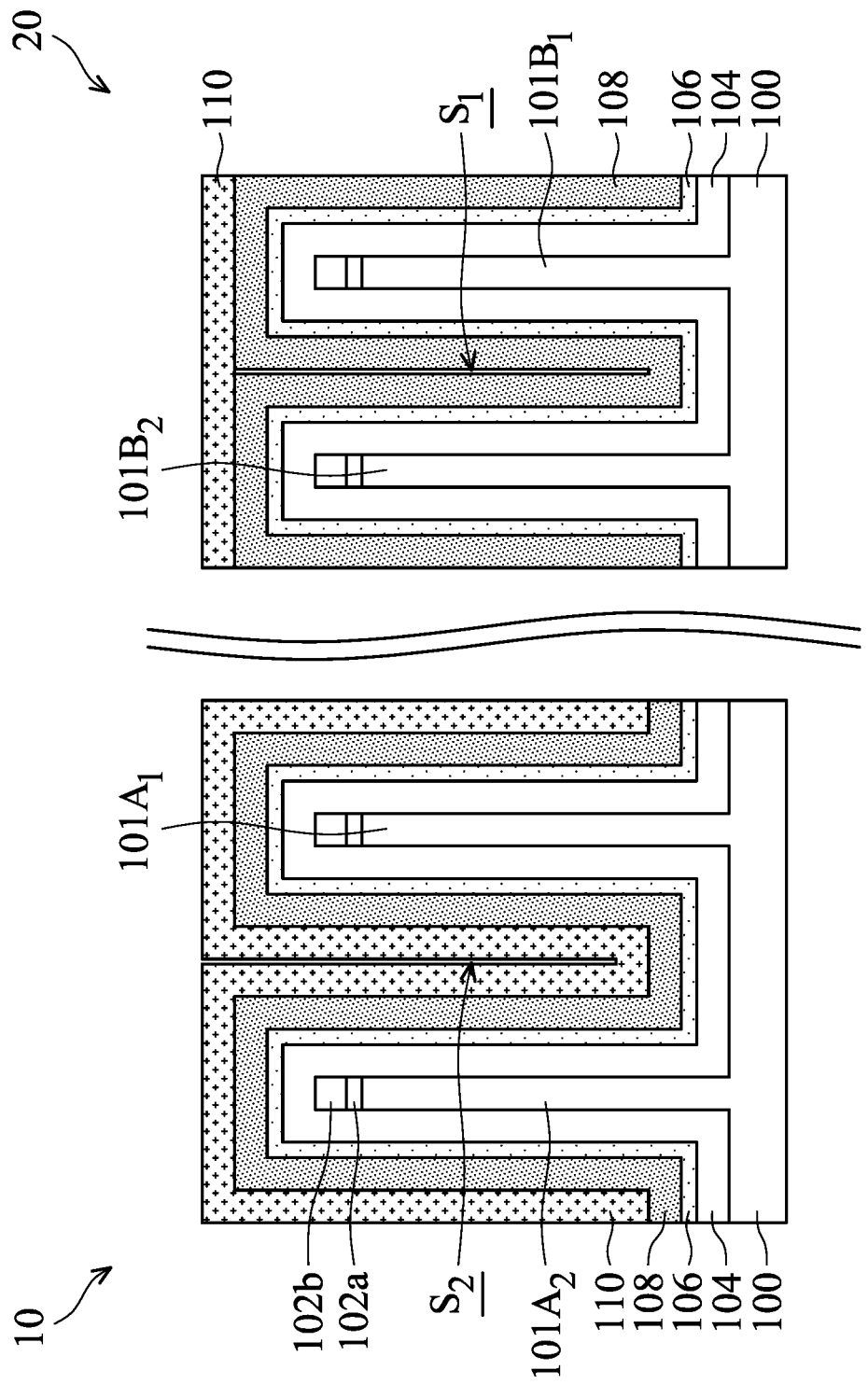

As shown in FIG. 1D, a second dielectric layer 110 is deposited over the dielectric layer 108, in accordance with some embodiments. In some embodiments, the second dielectric layer 110 extends along the sidewalls and the tops of the semiconductor protruding structures 101A$_1$-101A$_2$. In some embodiments, the second dielectric layer 110 conformally extends along the semiconductor protruding structures 101A$_1$-101A$_2$. In some embodiments, the second dielectric layer 110 covers and extends across the seam S$_1$ in the region 20, as shown in FIG. 1D. In some embodiments, the second dielectric layer 110 substantially does not extend into the seam S$_1$. In some embodiments, the second dielectric layer 110 is in direct contact with the dielectric layer 108.

In some embodiments, the second dielectric layer 110 is made of or includes a dielectric material. In some embodiments, the dielectric material contains nitrogen and/or carbon. The dielectric material may include carbon-containing silicon nitride, carbon-containing silicon oxynitride, silicon carbide, silicon oxynitride, silicon nitride, one or more other suitable materials, or a combination thereof. In some embodiments, the composition of the second dielectric layer 110 is substantially the same as that of the dielectric layer 108.

The second dielectric layer 110 may be deposited using an ALD process, a CVD process, one or more other applicable processes, or a combination thereof. In some embodiments, the dielectric layer 108 and the second dielectric layer 110 are sequentially formed in-situ in the same process chamber. In some embodiments, the vacuum of the process chamber is not broken during the formation of the dielectric layer 108 and the second dielectric layer 110.

In some embodiments, the second dielectric layer 110 substantially fills the remaining space of the trench between the semiconductor protruding structures $101A_1$ and $101A_2$. In some embodiments, a seam $S_2$ that is surrounded by the second dielectric layer 110 is formed, as shown in FIG. 1D. In some embodiments, the second dielectric layer 110 is formed using an ALD process, and the seam $S_2$ is naturally formed due to the characteristics of the ALD process for forming the second dielectric layer 110. The width of the seam $S_2$ may be in a range from 10 angstroms to about 50 angstroms.

Figure 1E:
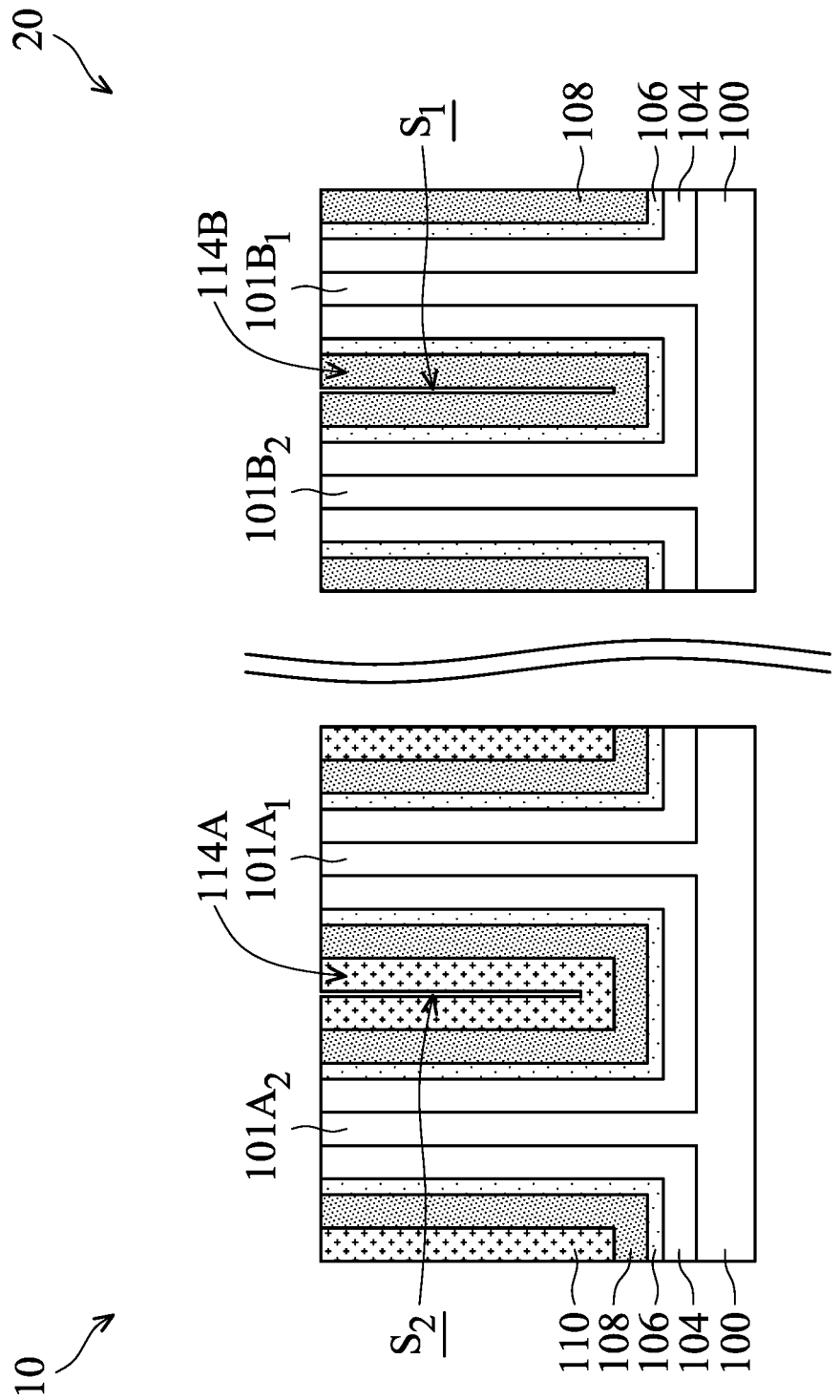

As shown in FIG. 1E, a planarization process is performed to the structure shown in FIG. 1D to expose the semiconductor protruding structures $101A_1$-$101A_2$ and $101B_1$-$101B_2$, in accordance with some embodiments. In some embodiments, the second dielectric layer 110, the dielectric layer 108, the interfacial layer 106, and the insulating layer 104 are partially removed during the planarization process. In some embodiments, the first mask layer 102a and the second mask layer 102b are also removed by the planarization process. As a result, the topmost surfaces of the second dielectric layer 110, the dielectric layer 108, the interfacial layer 106, and the insulating layer 104 are substantially level with each other, as shown in FIG. 1E. The planarization process may include a chemical mechanical polishing (CMP) process, a grinding process, a dry polishing process, an etching process, one or more other applicable processes, or a combination thereof.

As shown in FIG. 1E, portions of the dielectric layer 108 in the region 20 form multiple dielectric structures 114B. One of the dielectric structures 114B is positioned between the semiconductor protruding structures $101B_1$ and $101B_2$. In some embodiments, each of the dielectric structures 114B is a dielectric fin. In some embodiments, the semiconductor protruding structures $101B_1$ and $101B_2$ are semiconductor fins, and the dielectric structures 114B are dielectric fins. In some embodiments, in a top view, the longitudinal directions of the dielectric fins and the semiconductor fins are substantially parallel to each other.

As shown in FIG. 1E, portions of the dielectric layer 108 and the second dielectric layer 110 in the region 10 together form multiple dielectric structures 114A. One of the dielectric structures 114A is positioned between the semiconductor protruding structures $101A_1$ and $101A_2$. In some embodiments, each of the dielectric structures 114A is a dielectric fin. In some embodiments, the semiconductor protruding structures $101A_1$ and $101A_2$ are semiconductor fins, and the dielectric structures 114A are dielectric fins. In some embodiments, in a top view, the longitudinal directions of the dielectric fins and the semiconductor fins are substantially parallel to each other.

Figure 1F:
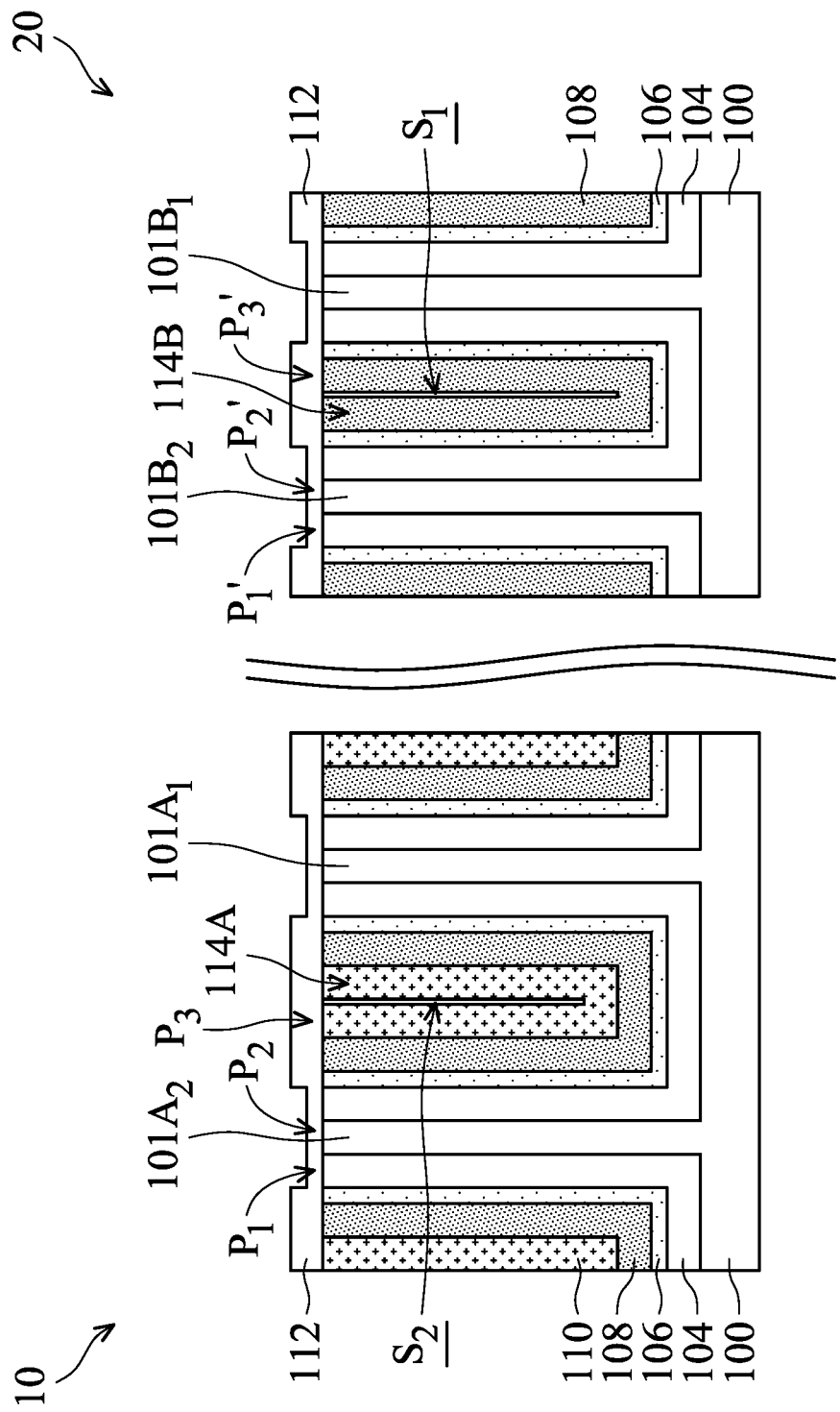

As shown in FIG. 1F, a protective layer 112 is formed on the surface of the structure shown in FIG. 1E, in accordance with some embodiments. The protective layer 112 covers the topmost surfaces of the dielectric structures 114A and 114B. That is, the topmost surfaces of the dielectric layer 108, the second dielectric layer 110, and the interfacial layer 106 are covered by the protective layer 112, as shown in FIG. 1F.

In some embodiments, the protective layer 112 is made of or includes a dielectric material. In some embodiments, the protective layer 112 contains nitrogen and/or carbon. In some embodiments, the protective layer 112 is free of oxygen. The protective layer 112 may be made of or include carbon-containing silicon nitride, silicon nitride, one or more other suitable materials, or a combination thereof.

In some embodiments, the protective layer 112 is deposited using an atomic layer deposition (ALD) process. In some embodiments, the reaction gases used in the ALD process include a silicon-containing gas and a nitrogen-containing gas. In some other embodiments, the reaction gases used in the ALD process further include a carbon-containing gas. In some embodiments, the reaction gases used in the ALD process include dichlorosilane, propylene, ammonia, one or more other suitable gases, or a combination thereof. The reaction temperature of the ALD process may be in a range from about 500 degrees C. to about 600 degrees C.

Due to the characteristics of the ALD process, the deposited material tends to be deposited on the surfaces with nitrogen-containing chemical bonds and/or carbon-containing chemical bonds. In some embodiments, the protective layer 112 is deposited at a faster rate on the surfaces of the dielectric layer 108, the second dielectric layer 110, and the interfacial layer 106. In some embodiments, the protective layer 112 is substantially not or merely slightly deposited on the surfaces of the insulating layer 104 and the semiconductor protruding structures $101A_1$-$101A_2$ and $101B_1$-$101B_2$. As a result, different portions of the protective layer 112 may have different thicknesses.

In some embodiments, the protective layer 112 is selectively deposited or mainly deposited on the surfaces of the dielectric layer 108, the second dielectric layer 110, and the interfacial layer 106. In some embodiments, the protective layer 112 is completely not deposited on the surfaces of the insulating layer 104 and the semiconductor protruding structures $101A_1$-$101A_2$ and $101B_1$-$101B_2$. In some other embodiments, the protective layer 112 is mainly deposited on the dielectric structures 114A and 114B and merely slightly deposited on the surfaces of the insulating layer 104 and the semiconductor protruding structures $101A_1$-$101A_2$ and $101B_1$-$101B_2$, as shown in FIG. 1F.

As shown in FIG. 1F, portions of the protective layer 112 directly above the dielectric structures 114A form protective elements $P_3$. Portions of the protective layer 112 directly above the dielectric structures 114B form protective elements $P_3'$. The protective elements $P_3$ and $P_3'$ may be used to protect the dielectric structures 114A and 114B thereunder during a subsequent etching process of the insulating layer 104. Each of the protective elements $P_3$ and $P_3'$ may have a thickness that is in a range from about 10 angstroms to about 20 angstroms. In some embodiments, the formation of the protective elements $P_3$ and $P_3'$ does not involve any photolithography process.

In some embodiments, the protective layer 112 further extends over the topmost surfaces of the insulating layer 104 and the semiconductor protruding structures $101A_1$-$101A_2$ and $101B_1$-$101B_2$, as shown in FIG. 1F. As shown in FIG. 1F, the protective layer 112 has portions $P_1$ and $P_1'$ that are directly above the topmost surfaces of the insulating layer 104. The protective layer 112 also has portions $P_2$ and $P_2'$ that are directly above the topmost surfaces of the semiconductor protruding structures $101A_1$-$101A_2$ and $101B_1$-$101B_2$. In some embodiments, each of the protective elements $P_3$ and $P_3'$ is much thicker than each of the portions $P_1$, $P_1'$, $P_2$, and $P_2'$ of the protective layer 112. Each of the portions $P_1$, $P_1'$, $P_2$, and $P_2'$ of the protective layer 112 may have a thickness that is in a range from about 1 angstroms to about 5 angstroms. In some embodiments, some portions of the topmost surfaces of the insulating layer 104 and the semiconductor protruding structures $101A_1$-$101A_2$ and $101B_1$-$101B_2$ are exposed without being covered by the protective layer.

Figure 1G:
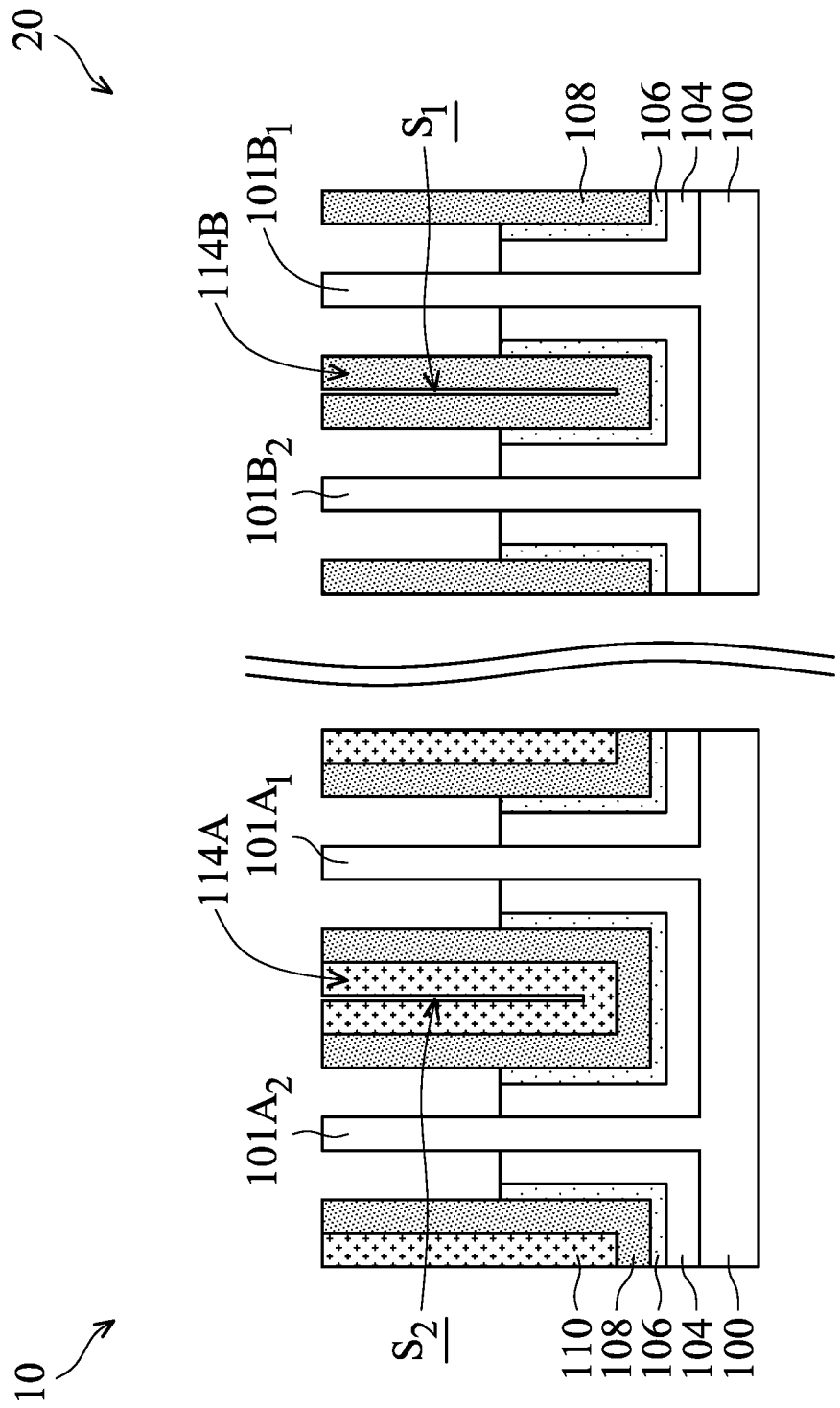

As shown in FIG. 1G, the insulating layer 104 is recessed, in accordance with some embodiments. The remaining insulating layer 104 may function as an isolation structure to prevent undesired current leakage between the semiconductor protruding structures $101A_1$-$101A_2$ and $101B_1$-$101B_2$. One or more etching processes may be used to partially remove the insulating layer 104. After the recessing of the insulating layer 104, the semiconductor protruding structures $101A_1$-$101A_2$ and $101B_1$-$101B_2$ and the dielectric structures 114A and 114B protrude from the topmost surfaces of the remaining portion of the insulating layer 104, as shown in FIG. 1G.

During the etching process for recessing the insulating layer 104, the protective elements $P_3$ and $P_3'$ are used to protect the dielectric structures 114A and 114B thereunder. As shown in FIG. 1F, since the portions $P_1$ and $P_1'$ are very thin, the etchant used in the etching process may reach the insulating layer 104 after the portions $P_1$ and $P_1'$ are consumed. Even if the portions $P_1$ and $P_1'$ that are very thin are consumed, the protective elements $P_3$ and $P_3'$ that are thicker still remain on the dielectric structures 114A and 114B. Due to the protection of the protective elements $P_3$ and $P_3'$, the profiles and dimensions of the dielectric structures 114A and 114B may be substantially maintained during the recessing the insulating layer 104. The reliability and performance of the semiconductor device structure are thus ensured.

In some embodiments, the protective elements $P_3$ and $P_3'$ are consumed during the recessing of the insulating layer 104. In some embodiments, the protective elements $P_3$ and $P_3'$ are completely consumed during the recessing of the insulating layer 104.

As a result, no protective element remains on the topmost surfaces of the dielectric structures 114A and 114B after the recessing of the insulating layer 104, as shown in FIG. 1G.

Afterwards, the interfacial layer 106 is then partially removed to enlarge the space between the nearby dielectric structures 114A or 114B, as shown in FIG. 1G in accordance with some embodiments. As a result, additional space is provided for the subsequent growth of source/drain structures. After the partial removal of the interfacial layer 106, the topmost surfaces of the interfacial layer 106 are below the topmost surfaces of the dielectric structures 114A and 114B. In some embodiments, the topmost surfaces of the interfacial layer 106 are substantially level with the topmost surfaces of the insulating layer.

In some embodiments, the interfacial layer 106 is partially removed using one or more etching processes. As mentioned above, in some embodiments, the etching rate of the interfacial layer 106 is faster than the dielectric layer 108. Since the etching rate of the dielectric layer 108 is lower, the dielectric structures 114A and 114B may substantially sustain the etching process of the interfacial layer 106.

Many variations and/or modifications can be made to embodiments of the disclosure. In some other embodiments, no additional etching process is used to recess the interfacial layer 106. In some embodiments, the interfacial layer 106 is recessed by the etching process used for recessing the insulating layer 104.

Figure 2A:
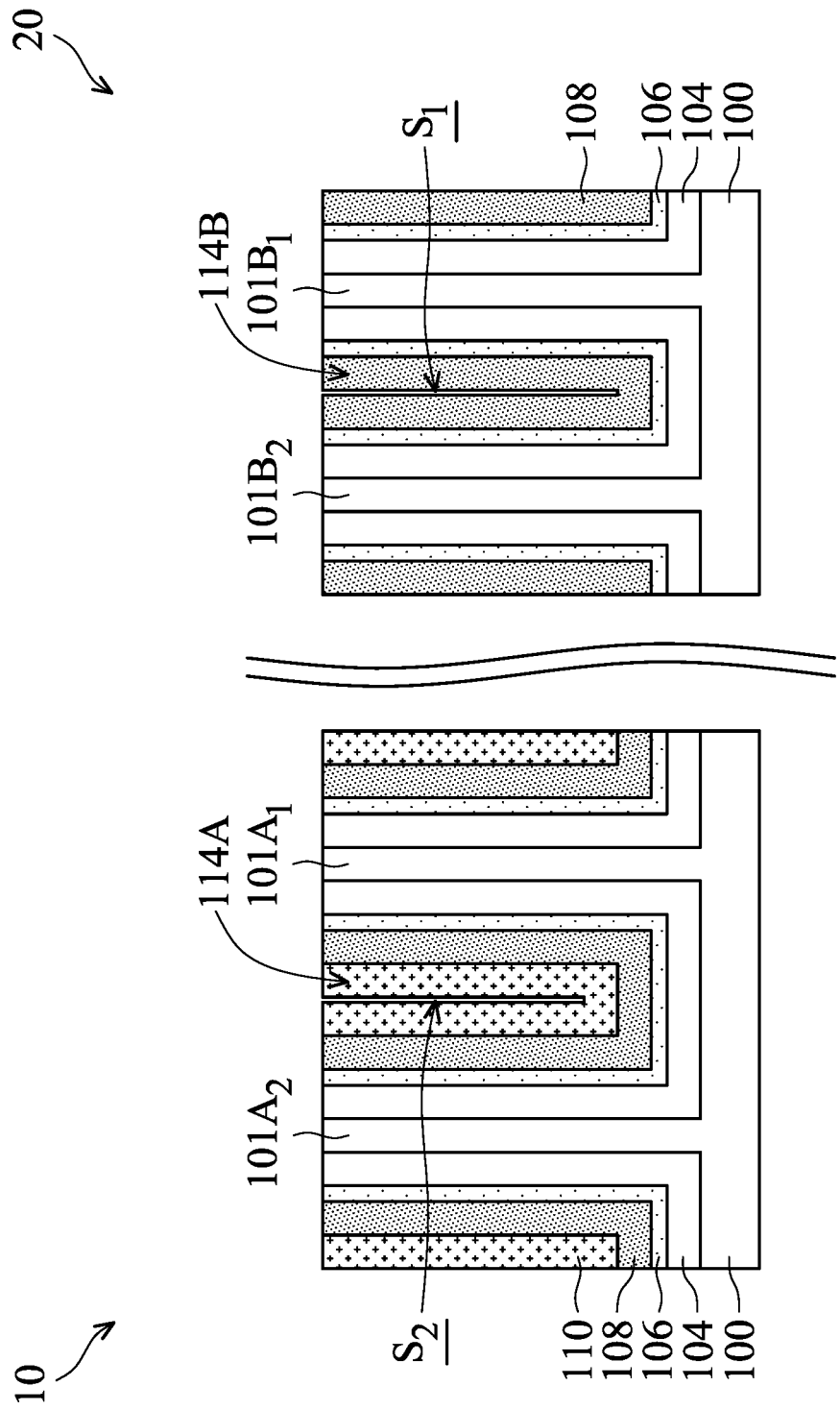
FIGS. 2A-2C are cross-sectional views of various stages of a process for forming a portion of a semiconductor device structure, in accordance with some embodiments.
Figure 2B:
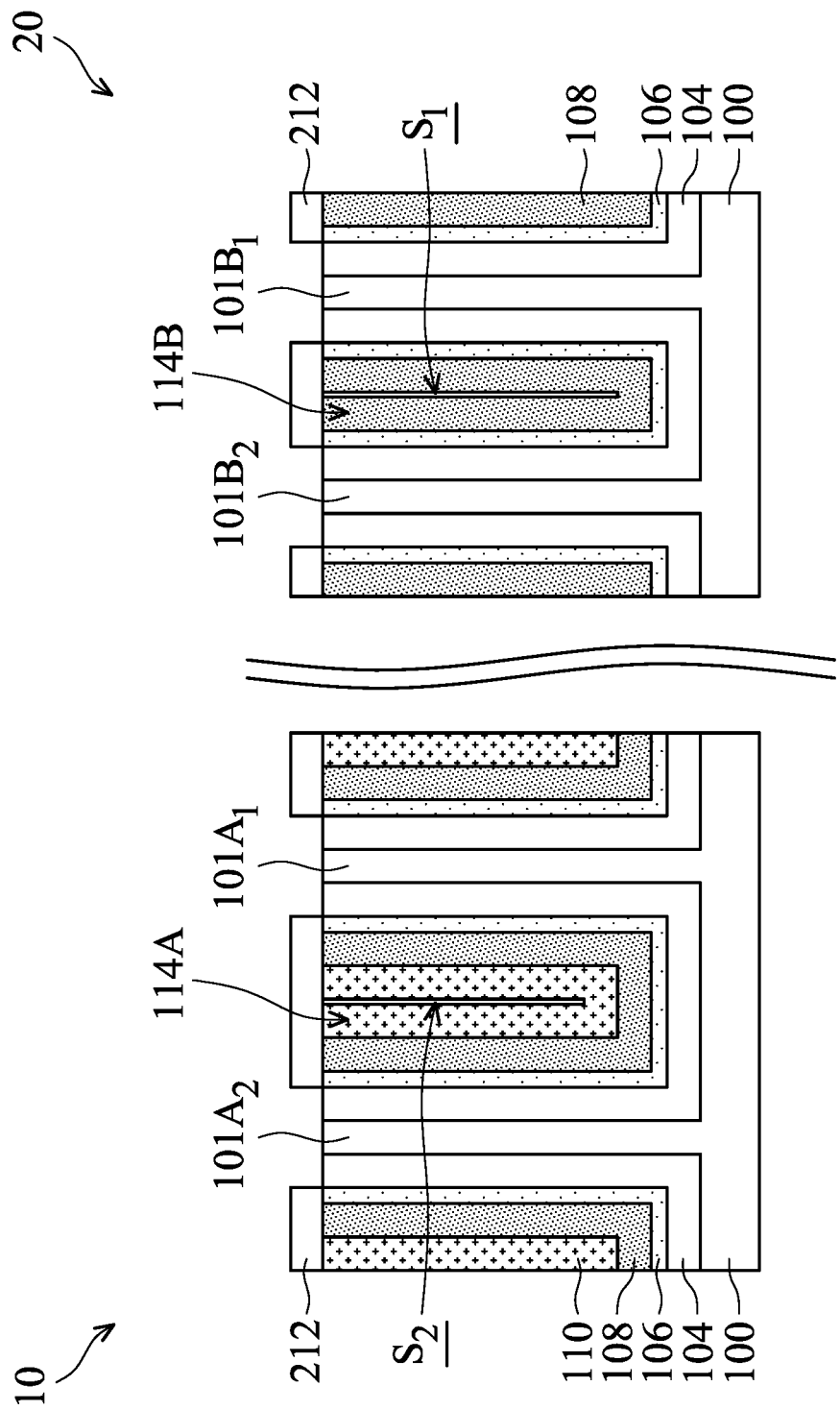
Figure 2C:
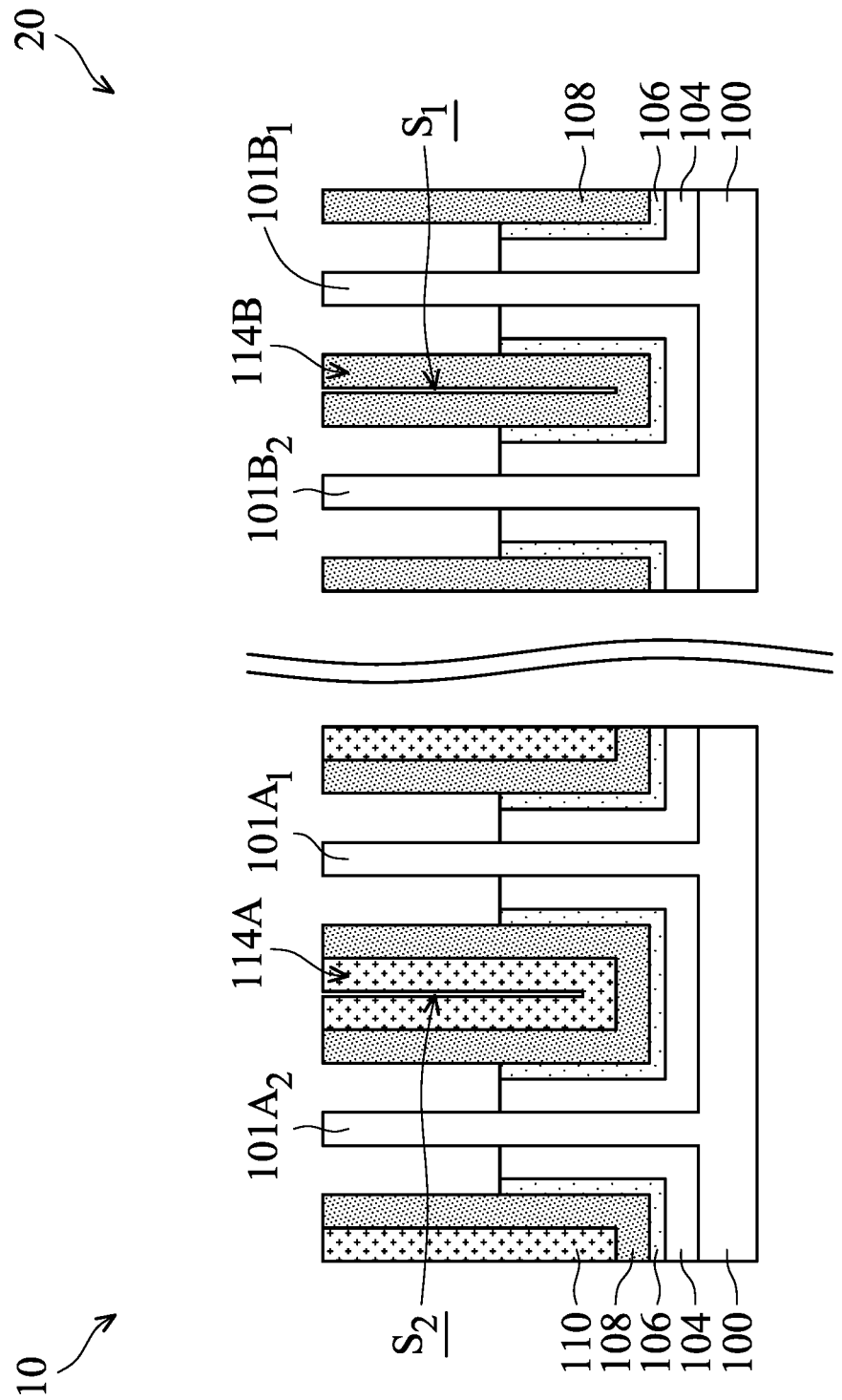

Many variations and/or modifications can be made to embodiments of the disclosure. FIGS. 2A-2C are cross-sectional views of various stages of a process for forming a portion of a semiconductor device structure, in accordance with some embodiments.

As shown in FIG. 2A, a structure the same as or similar to the structure shown in FIG. 1E is formed. Afterwards, similar to the embodiments illustrated in FIG. 1F, protective elements 212 are selectively formed directly on the dielectric structures 114A and 114B, as shown in FIG. 2B in accordance with some embodiments. The material and formation method of the protective elements 212 may be the same as or similar to those of the protective elements $P_3$ and $P_3'$ as illustrated in FIG. 1F.

In some embodiments, the deposited protective material used for forming the protective elements 212 is completely not (or substantially not) deposited on the surfaces of the insulating layer 104 and the semiconductor protruding structures $101A_1$-$101A_2$ and $101B_1$-$101B_2$, as shown in FIG. 2B. In some embodiments, the formation of the protective elements 212 (or the protective elements) does not involve any photolithography process.

However, embodiments of the disclosure are not limited thereto. Many variations and/or modification can be made to embodiments of the disclosure. In some other embodiments, a protective layer is formed to cover the entire top surface of the structure shown in FIG. 2A. Afterwards, the protective layer is patterned using one or more photolithography processes and one or more etching processes. As a result, the protective elements 212 are formed. For example, a patterned photoresist layer is formed over the protective layer to assist in the patterning of the protective layer. With the patterned photoresist layers as an etching mask, the protective layer is partially removed. As a result, the protective elements 212 are formed.

As shown in FIG. 2C, similar to the embodiments illustrated in FIG. 1G, the insulating layer 104 and the interfacial layer 106 are partially removed, in accordance with some embodiments. As a result, the semiconductor protruding structures $101A_1$-$101A_2$ and $101B_1$-$101B_2$ and the dielectric structures 114A and 114B protrude from the topmost surface of the remaining portion of the insulating layer 104.

Figure 3A:
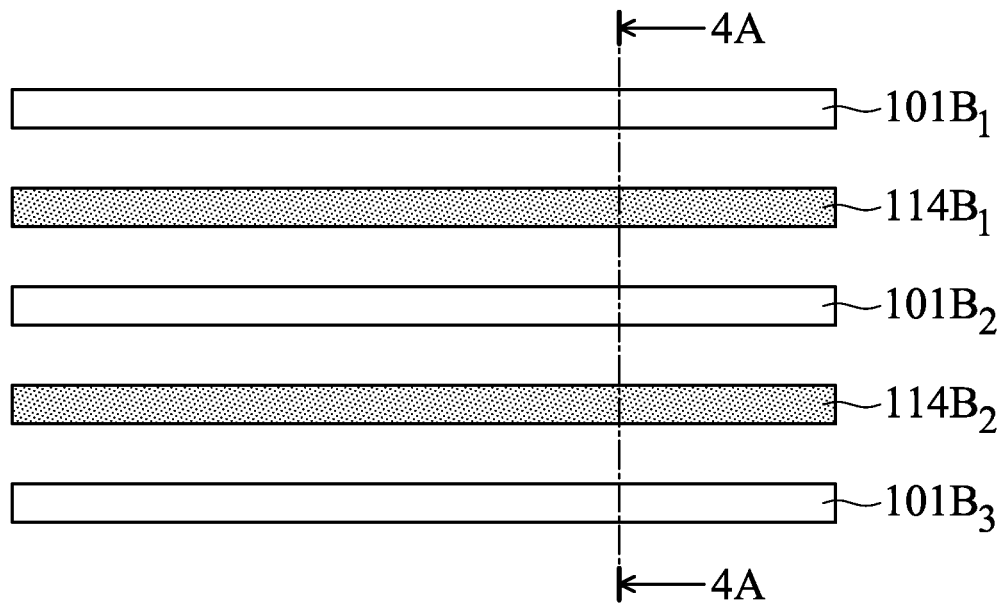
FIGS. 3A-3B are top views of various stages of a process for forming a portion of a semiconductor device structure, in accordance with some embodiments.
Figure 3B:
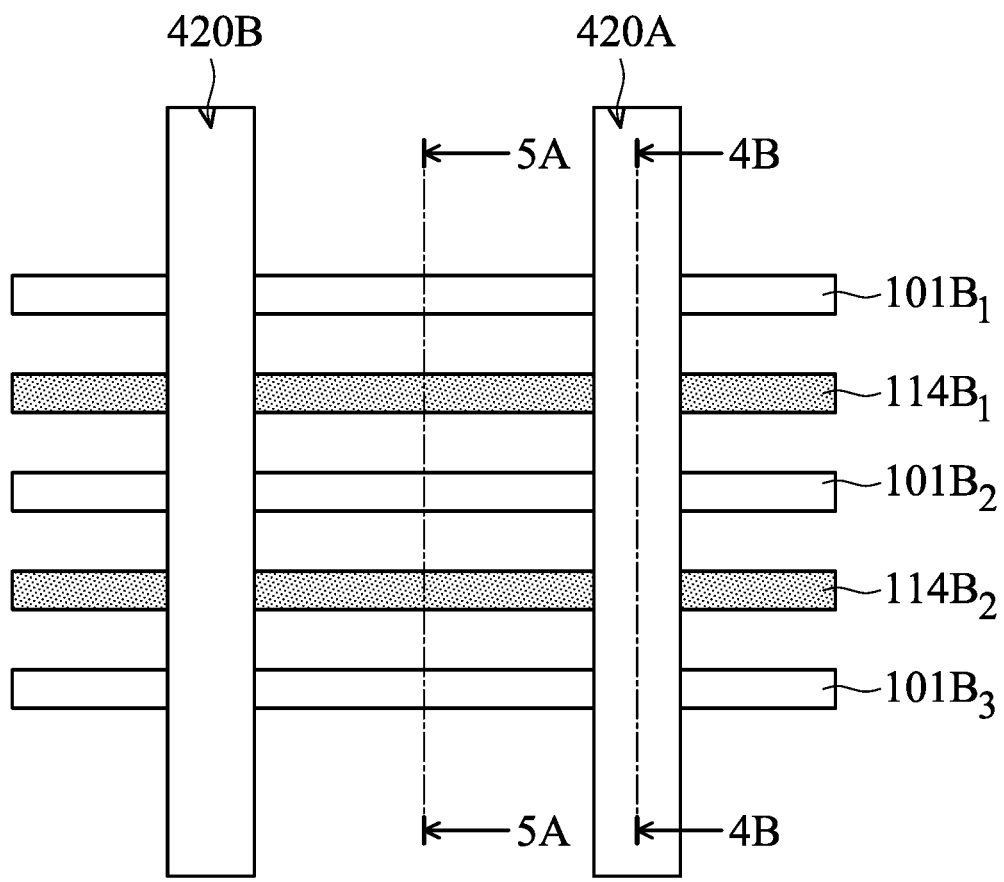
Figure 4A:
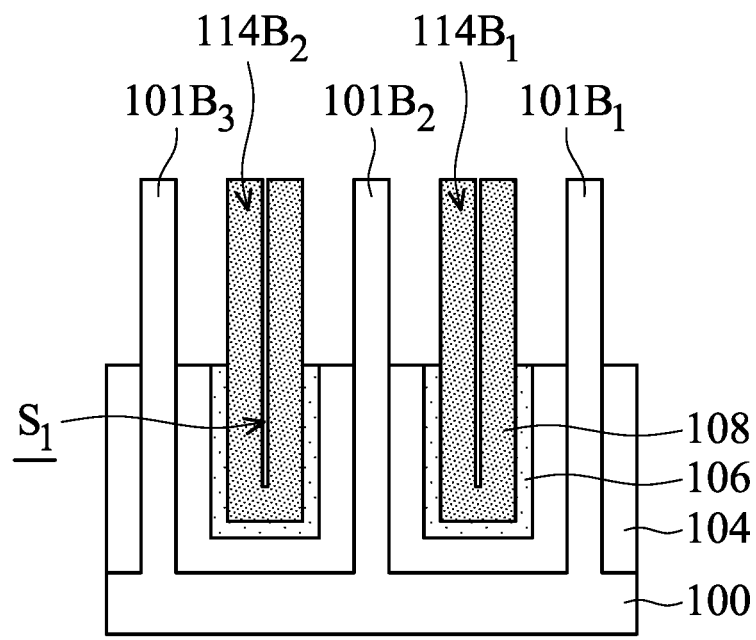
FIGS. 4A-4C are cross-sectional views of various stages of a process for forming a portion of a semiconductor device structure, in accordance with some embodiments.
Figure 4B:
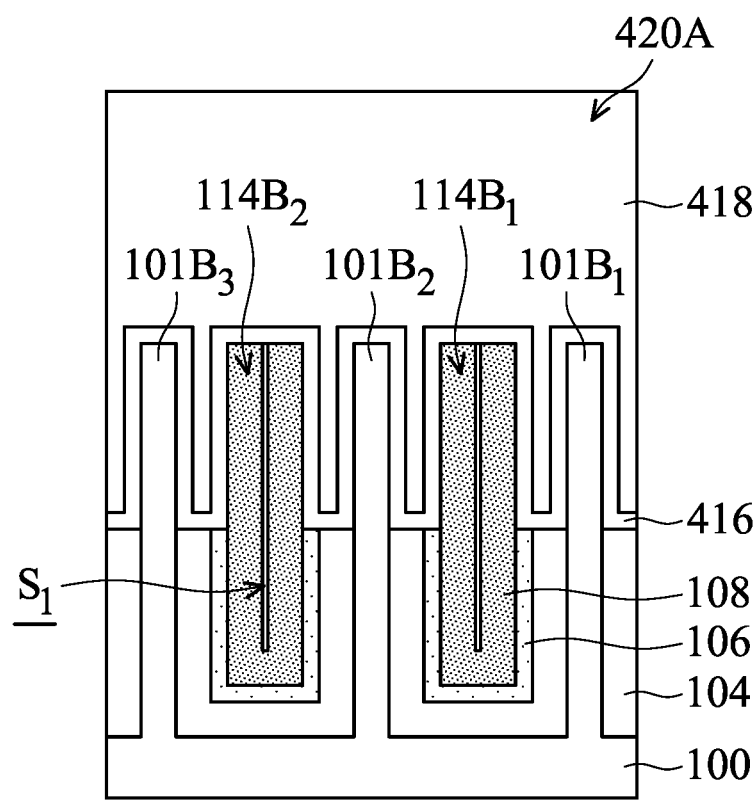
Figure 4C:
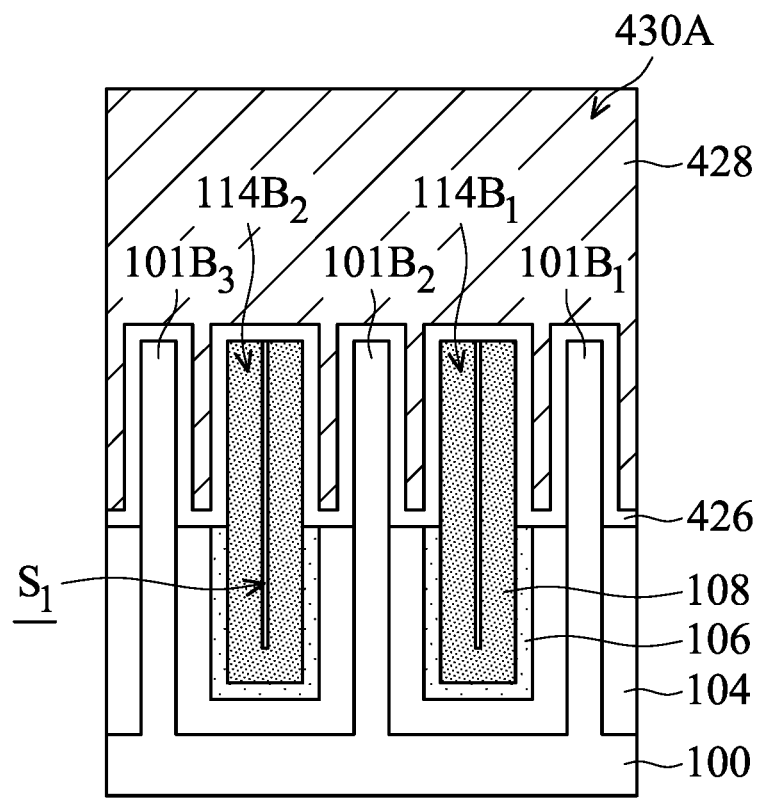

Many variations and/or modification can be made to embodiments of the disclosure. FIGS. 3A-3B are top views of various stages of a process for forming a portion of a semiconductor device structure, in accordance with some embodiments. FIGS. 4A-4C are cross-sectional view of various stages of a process for forming a portion of a semiconductor device structure, in accordance with some embodiments. FIGS. 5A-5D are cross-sectional view of various stages of a process for forming a portion of a semiconductor device structure, in accordance with some embodiments.

In some embodiments, FIG. 4A is a cross-sectional view of the structure taken along the line 4A-4A in FIG. 3A. FIG. 4A shows a structure that is similar to the structure in the region 20 shown in FIG. 1G. In some embodiments, the longitudinal directions of semiconductor protruding structures $101B_1$-$101B_3$ and dielectric structures $114B_1$-$114B_2$ are substantially parallel to each other, as shown in FIG. 3A. The semiconductor protruding structures $101B_1$-$101B_3$ and dielectric structures $114B_1$-$114B_2$ may be formed using similar methods as illustrated in FIGS. 1A-1G.

Figure 5A:
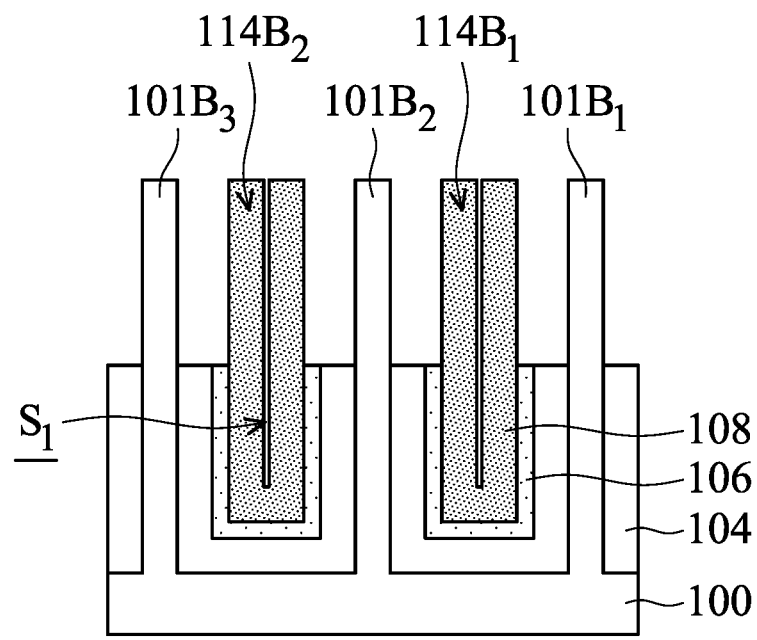
FIGS. 5A-5D are cross-sectional views of various stages of a process for forming a portion of a semiconductor device structure, in accordance with some embodiments.

Afterwards, dummy gate stacks 420A and 420B are formed, as shown in FIGS. 3B and 4B in accordance with some embodiments. In some embodiments, FIG. 4B shows the cross-sectional view of the structure taken along the line 4B-4B in FIG. 3B. In some embodiments, FIG. 5A shows the cross-sectional view of the structure taken along the line 5A-5A in FIG. 3B.

As shown in FIGS. 3B and 4B, the dummy gate stacks 420A and 420B are formed to partially cover and to extend across the semiconductor protruding structures $101B_1$-$101B_3$ and the dielectric structures $114B_1$-$114B_2$, in accordance with some embodiments. In some embodiments, the dummy gate stacks 420A and 420B wraps around the semiconductor protruding structures $101B_1$-$101B_3$ and the dielectric structures $114B_1$-$114B_2$, as shown in FIG. 4B. As shown in FIG. 5A, other portions of the semiconductor protruding structures $101B_1$-$101B_3$ and the dielectric structures $114B_1$-$114B_2$ remain exposed without being covered by the dummy gate stacks 420A and 420B.

As shown in FIGS. 3B and 4B, each of the dummy gate stacks 420A and 420B includes a dummy gate dielectric layer 416 and a dummy gate electrode 418. The dummy gate dielectric layer 416 may be made of or include silicon oxide. The dummy gate electrode 418 may be made of or include polysilicon. In some embodiments, a dummy gate dielectric material layer and a dummy gate electrode layer are sequentially deposited over the dielectric structures $114B_1$-$114B_2$ and the semiconductor protruding structures $101B_1$-$101B_3$. Afterwards, the dummy gate dielectric material layer and the dummy gate electrode layer are patterned to form the dummy gate stacks 420A and 420B.

Figure 5B:
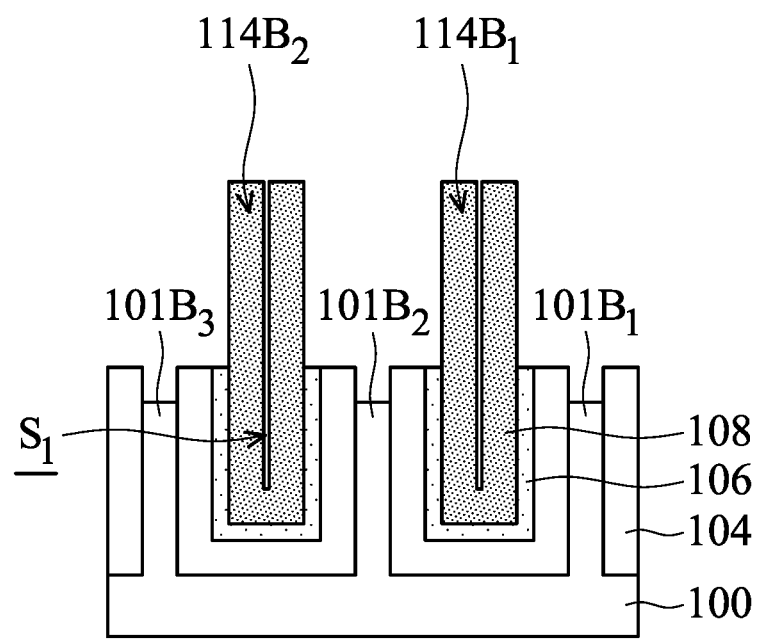

As shown in FIG. 5B, the portions of the semiconductor protruding structures $101B_1$-$101B_3$ that are not covered by the dummy gate stacks 420A and 420B are partially removed, in accordance with some embodiments. One of more etching processes may be used to recess the semiconductor protruding structures $101B_1$-$101B_3$. As shown in FIG. 5B, the dielectric structure $114B_1$-$114B_2$ are substantially not etched by the etchant used for recessing the semiconductor protruding structures $101B_1$-$101B_3$.

Figure 5C:
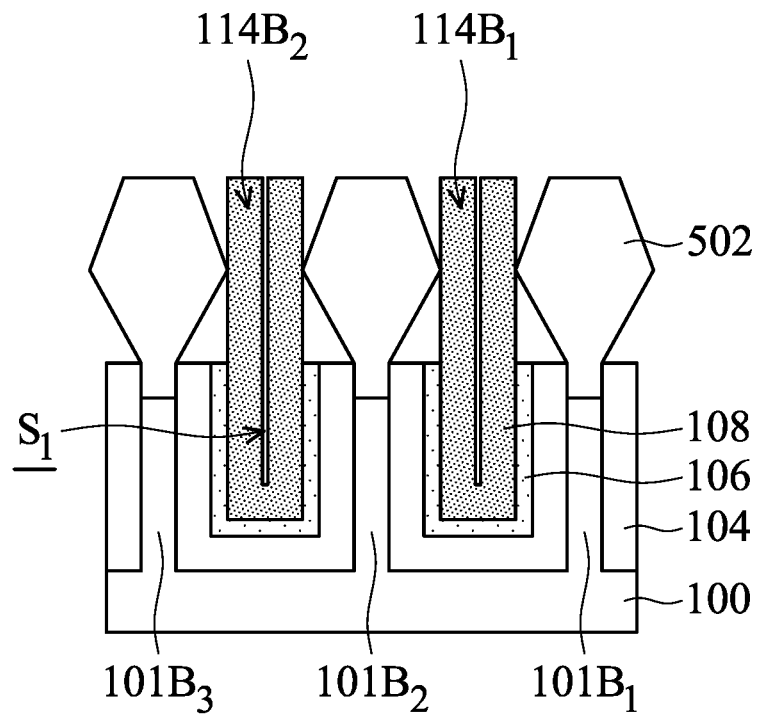

As shown in FIG. 5C, epitaxial structures 502 are formed over the semiconductor protruding structures $101B_1$-$101B_3$, in accordance with some embodiments. In some embodiments, the epitaxial structures 502 function as source/drain structures.

In some embodiments, the epitaxial structures 502 are p-type semiconductor structures. For example, the epitaxial structures 502 may include epitaxially grown silicon germanium or silicon germanium doped with boron. It should be appreciated, however, that the epitaxial structures 502 are not limited to being p-type semiconductor structures. In some embodiments, the epitaxial structures 502 are n-type semiconductor structures. The epitaxial structures 502 may include epitaxially grown silicon, epitaxially grown silicon carbide (SiC), epitaxially grown silicon phosphide (SiP), or another suitable epitaxially grown semiconductor material. Alternatively, some of the epitaxial structures 502 is p-type semiconductor structures while others are n-type semiconductor structures.

In some embodiments, the epitaxial structures 502 are formed by using a selective epitaxial growth (SEG) process, a CVD process (e.g., a vapor-phase epitaxy (VPE) process, a low pressure chemical vapor deposition (LPCVD) process, and/or an ultra-high vacuum CVD (UHV-CVD) process), a molecular beam epitaxy process, one or more other applicable processes, or a combination thereof.

In some embodiments, the epitaxial structures 502 are doped with one or more suitable dopants. For example, the epitaxial structures 502 are SiGe source/drain features doped with boron (B), indium (In), or another suitable dopant. Alternatively, in some other embodiments, the epitaxial structures 502 are Si source/drain features doped with phosphor (P), antimony (Sb), or another suitable dopant.

In some embodiments, the epitaxial structures 502 are doped in-situ during their epitaxial growth. In some other embodiments, the epitaxial structures 502 are not doped during the growth of the epitaxial structures 502. Instead, after the formation of the epitaxial structures 502, the epitaxial structures 502 are doped in a subsequent process. In some embodiments, the doping is achieved by using an ion implantation process, a plasma immersion ion implantation process, a gas and/or solid source diffusion process, one or more other applicable processes, or a combination thereof. In some embodiments, the epitaxial structures 502 are further exposed to one or more annealing processes to activate the dopants. For example, a rapid thermal annealing process is used.

The dielectric structures $114B_1$-$114B_2$ may be used to prevent the neighboring epitaxial structures 502 from being merged together. In some embodiments, the epitaxial structures 502 are separated from each other by the dielectric structures $114B_1$-$114B_2$. In some embodiments, each of the dielectric structures $114B_1$-$114B_2$ is in direct contact with one or two of the epitaxial structures 502, as shown in FIG. 5C.

Figure 5D:
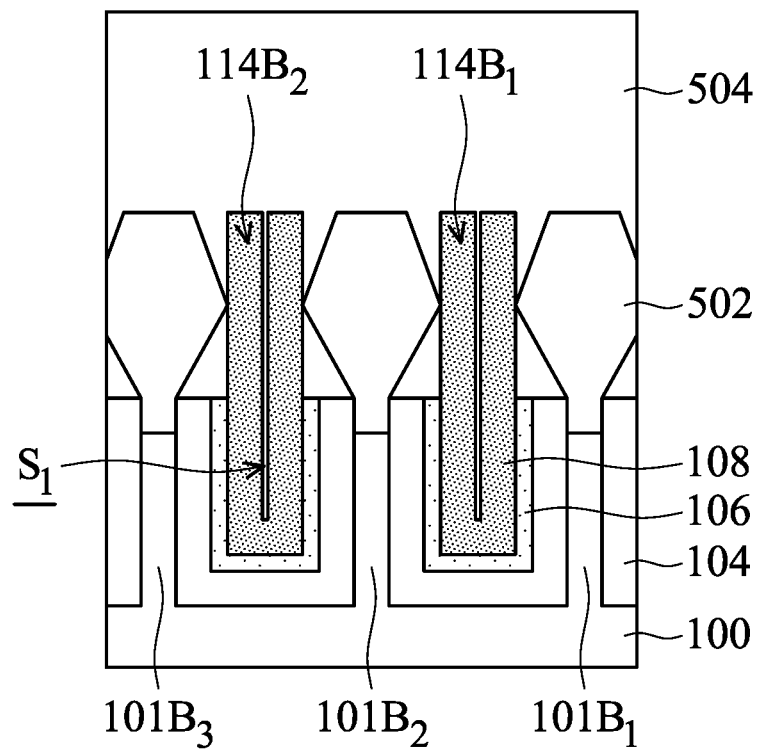

As shown in FIG. 5D, a dielectric layer 504 is formed to cover the epitaxial structures 502 and the dielectric structures $114B_1$-$114B_2$, in accordance with some embodiments. The dielectric layer 504 further laterally surrounds the dummy gate stacks 420A and 420B. The dielectric layer 504 may be made of or include silicon oxide, silicon oxynitride, borosilicate glass (BSG), phosphoric silicate glass (PSG), borophosphosilicate glass (BPSG), fluorinated silicate glass (FSG), low-k material, porous dielectric material, one or more other suitable materials, or a combination thereof.

In some embodiments, a dielectric material layer is deposited using an FCVD process, a CVD process, an ALD process, one or more other applicable processes, or a combination thereof. Afterwards, a planarization process is used to partially remove the dielectric material layer. As a result, the remaining portions of the dielectric material layer form the dielectric layer 504. The planarization process may include a CMP process, a grinding process, an etching process, a dry polishing process, one or more other applicable processes, or a combination thereof. In some embodiments, the mask layers 122 and 124 are removed during the planarization process. In some embodiments, after the planarization process, the top surfaces of the dielectric layer 504, and the dummy gate electrodes 418 are substantially level with each other.

Afterwards, the dummy gate stack 420A is replaced with a metal gate stack 430A, as shown in FIG. 4C in accordance with some embodiments. One or more etching processes may be used to remove the dummy gate stack 420A. As a result, a trench that exposes the semiconductor protruding structures $101B_1$-$101B_3$ and the dielectric structures $114B_1$-$114B_2$ is formed. Afterwards, the metal gate stack 430A is formed in the trench to wrap around the semiconductor protruding structures $101B_1$-$101B_3$ and the dielectric structures $114B_1$-$114B_2$, as shown in FIG. 4C.

The metal gate stack 430A may include multiple metal gate stack layers. The metal gate stack 430A may include a gate dielectric layer 426 and a metal gate electrode 428. The metal gate electrode 428 may include a work function adjusting layer and a conductive filling layer. In some embodiments, the formation of the metal gate stack 430A involves the deposition of multiple metal gate stack layers over the dielectric layer 504 to fill the trenches formed after the removal of the dummy gate stacks.

In some embodiments, the gate dielectric layer 426 is made of or includes a dielectric material with high dielectric constant (high-K). The gate dielectric layer 426 may be made of or include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, one or more other suitable high-K materials, or a combination thereof. The gate dielectric layer 426 may be deposited using an ALD process, a CVD process, one or more other applicable processes, or a combination thereof.

In some embodiments, before the formation of the gate dielectric layer 426, an interfacial layer is formed on the surfaces of the semiconductor protruding structures $101B_1$-$101B_3$. The interfacial layers are very thin and are made of, for example, silicon oxide or germanium oxide. In some embodiments, the interfacial layers are formed by applying an oxidizing agent on the surfaces of the semiconductor protruding structures $101B_1$-$101B_3$. For example, a hydrogen peroxide-containing liquid may be applied or provided on the surfaces of the semiconductor protruding structures $101B_1$-$101B_3$ so as to form the interfacial layers.

The work function adjusting layer may be used to provide the desired work function for transistors to enhance device performance including improved threshold voltage. In some embodiments, the work function adjusting layer is used for forming an NMOS device. The work function adjusting layer is an n-type work function adjusting layer. The n-type work function adjusting layer is capable of providing a work function value suitable for the device, such as equal to or less than about 4.5 eV.

The n-type work function adjusting layer may include metal, metal carbide, metal nitride, or a combination thereof. For example, the n-type work function adjusting layer includes titanium nitride, tantalum, tantalum nitride, one or more other suitable materials, or a combination thereof. In some embodiments, the n-type work function is an aluminum-containing layer. The aluminum-containing layer may be made of or include TiAlC, TiAlO, TiAlN, one or more other suitable materials, or a combination thereof.

The work function adjusting layer may also be made of or include hafnium, zirconium, titanium, tantalum, aluminum, metal carbides (e.g., hafnium carbide, zirconium carbide, titanium carbide, aluminum carbide), aluminides, ruthenium, palladium, platinum, cobalt, nickel, conductive metal oxides, or a combinations thereof. The thickness and/or the compositions of the work function adjusting layer may be fine-tuned to adjust the work function level.

The work function adjusting layer may be deposited over the gate dielectric layer 426 using an ALD process, a CVD process, a PVD process, an electroplating process, an electroless plating process, one or more other applicable processes, or a combination thereof.

In some embodiments, a barrier layer is formed before the work function adjusting layer to interface the gate dielectric layer 426 with the subsequently formed work function adjusting layer. The barrier layer may also be used to prevent diffusion between the gate dielectric layer 426 and the subsequently formed work function adjusting layer. The barrier layer may be made of or include a metal-containing material. The metal-containing material may include titanium nitride, tantalum nitride, one or more other suitable materials, or a combination thereof. The barrier layer may be deposited using an ALD process, a CVD process, a PVD process, an electroplating process, an electroless plating process, one or more other applicable processes, or a combination thereof.

In some embodiments, the conductive filling layer is made of or includes a metal material. The metal material may include tungsten, aluminum, copper, cobalt, one or more other suitable materials, or a combination thereof. A conductive layer used for forming the conductive filling layer may be deposited over the work function adjusting layer using a CVD process, an ALD process, a PVD process, an electroplating process, an electroless plating process, a spin coating process, one or more other applicable processes, or a combination thereof.

In some embodiments, a blocking layer is formed over the work function adjusting layer before the formation of the conductive layer used for forming the conductive filling layer. The blocking layer may be used to prevent the subsequently formed conductive layer from diffusing or penetrating into the work function adjusting layer. The blocking layer may be made of or include tantalum nitride, titanium nitride, one or more other suitable materials, or a combination thereof. The blocking layer may be deposited using an ALD process, a PVD process, an electroplating process, an electroless plating process, one or more other applicable processes, or a combination thereof.

Afterwards, a planarization process is performed to remove the portions of the metal gate stack layers outside of the trenches, in accordance with some embodiments. As a result, the remaining portions of the metal gate stack layers form the metal gate stack 430A, as shown in FIG. 4C.

Figure 6:
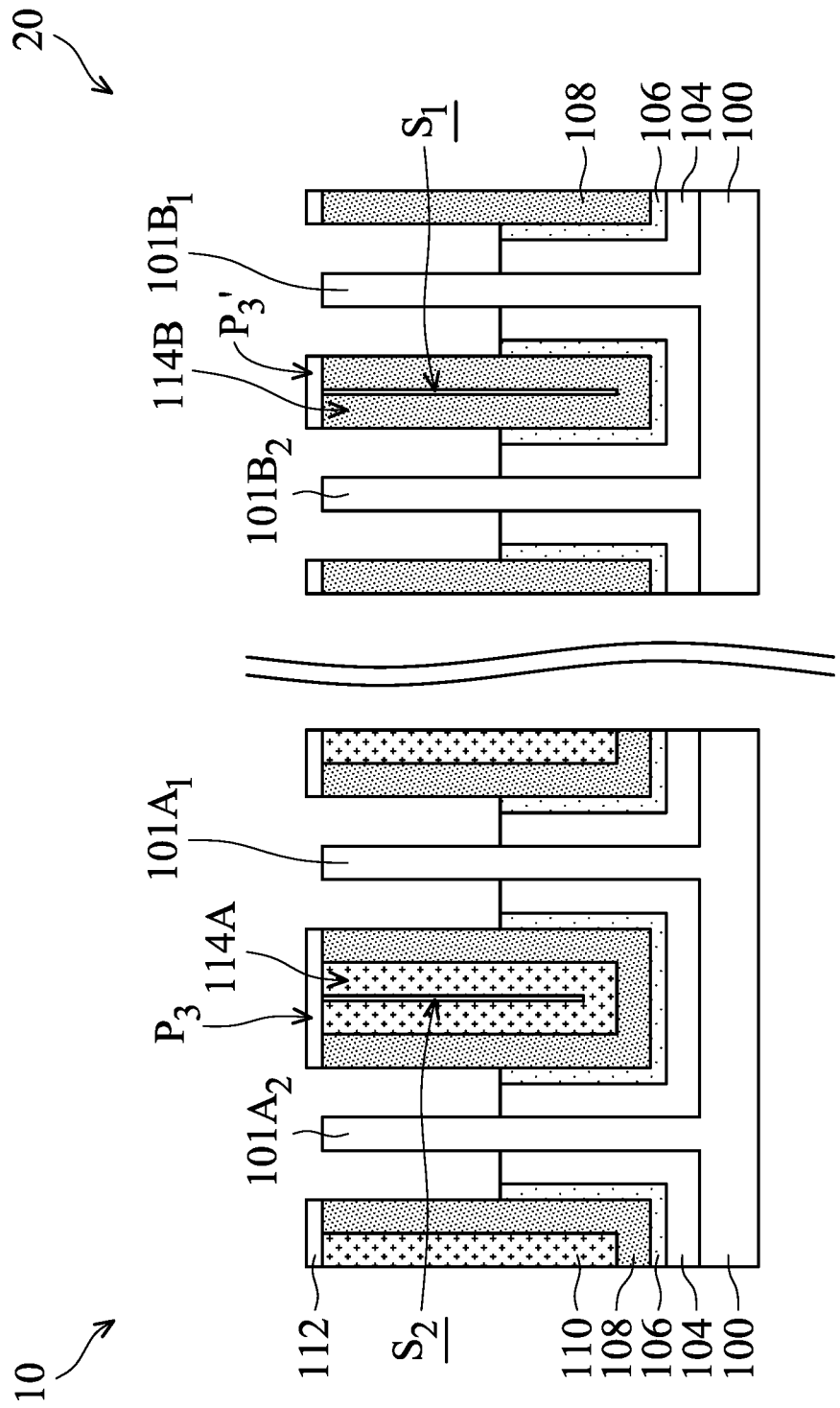
FIG. 6 is a cross-sectional view of a portion of a semiconductor device structure, in accordance with some embodiments.

In some embodiments, the protective elements are completely consumed after the recessing of the insulating layer 104. However, embodiments of the disclosure are not limited thereto. Many variations and/or modifications can be made to embodiments of the disclosure. FIG. 6 is a cross-sectional view of a portion of a semiconductor device structure, in accordance with some embodiments.

In some embodiments, the protective elements $P_3$ and $P_3'$ partially remain on the topmost surfaces of the dielectric structures 114A and 114B without being completely consumed during the recessing of the insulating layer 104, as shown in FIG. 6. In some embodiments, each of the protective elements $P_3$ and $P_3'$ becomes thinner after the recessing of the insulating layer 104. In some embodiments, the edge of each of the protective elements $P_3$ and $P_3'$ is substantially aligned with the edge of the dielectric structure 114A (or 114B) thereunder, as shown in FIG. 6.

Figure 7:
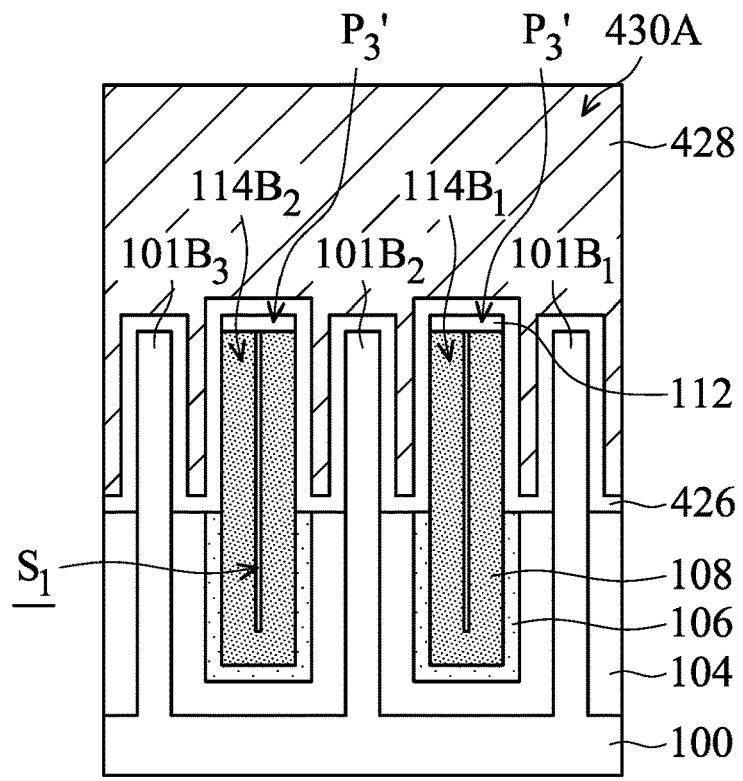
FIG. 7 is a cross-sectional view of a portion of a semiconductor device structure, in accordance with some embodiments.

Many variations and/or modifications can be made to embodiments of the disclosure. FIG. 7 is a cross-sectional view of a portion of a semiconductor device structure, in accordance with some embodiments. In some embodiments, a structure similar to the structure shown in FIG. 4C is formed. Similar to the embodiments illustrated in FIG. 6, the protective elements $P_3'$ remain without being completely consumed. In some embodiments, each of the protective elements $P_3'$ is between the metal gate stack 430A and the respective dielectric structure $114B_1$ (or $114B_2$), as shown in FIG. 7.

Figure 8:
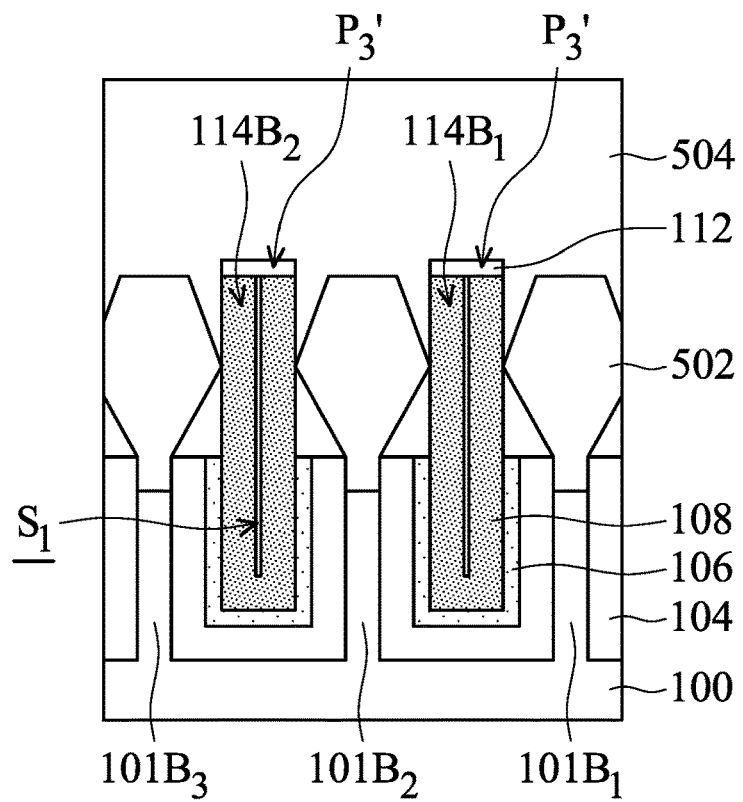
FIG. 8 is a cross-sectional view of a portion of a semiconductor device structure, in accordance with some embodiments.

Many variations and/or modifications can be made to embodiments of the disclosure. FIG. 8 is a cross-sectional view of a portion of a semiconductor device structure, in accordance with some embodiments. In some embodiments, a structure similar to the structure shown in FIG. 5D is formed. Similar to the embodiments illustrated in FIG. 6, the protective elements $P_3'$ remain without being completely consumed. In some embodiments, each of the protective elements $P_3'$ is between the dielectric layer 504 and the respective dielectric structure $114B_1$ (or $114B_2$), as shown in FIG. 8. In some embodiments, the protective element $P_3'$ is partially covered by the metal gate stack 430A and partially covered by the dielectric layer 504, as shown in FIGS. 7 and 8.

Embodiments of the disclosure form a semiconductor device structure with multiple semiconductor protruding structures and dielectric structures. The dielectric structures are formed between the semiconductor protruding structures to prevent some neighboring epitaxial structures from being merged together. During the formation of the dielectric structures, selectively deposited protective elements are formed to protect the dielectric structures thereunder. Due to the protection of the protective elements, the profiles and dimensions of the dielectric structures may be substantially maintained during the subsequent etching processes. Undesired merging between nearby epitaxial structures is significantly prevented. The reliability and performance of the semiconductor device structure are thus ensured.

In accordance with some embodiments, a method for forming a semiconductor device structure is provided. The method includes forming a semiconductor protruding structure over a substrate and forming an insulating layer along sidewalls and a top of the semiconductor protruding structure. The method also includes forming a dielectric layer over the insulating layer and planarizing the dielectric layer and the insulating layer to expose the top of the semiconductor protruding structure. A remaining portion of the dielectric layer forms a dielectric structure. The method further includes forming a protective element to cover a top of the dielectric structure. In addition, the method includes recessing the insulating layer after the protective element is formed such that the semiconductor protruding structure and the dielectric structure protrude from a top surface of a remaining portion of the insulating layer.

In accordance with some embodiments, a method for forming a semiconductor device structure is provided. The method includes forming a semiconductor protruding structure over a substrate and surrounding the semiconductor protruding structure with an insulating layer. The method also includes forming a dielectric layer over the insulating layer. The method further includes partially removing the dielectric layer and insulating layer using a planarization process. As a result, topmost surfaces of the semiconductor protruding structure, the insulating layer, and the dielectric layer are substantially level with each other. In addition, the method includes forming a protective layer to cover the topmost surfaces of the dielectric layer. The method includes recessing the insulating layer after the protective layer is formed such that the semiconductor protruding structure and a portion of the dielectric layer protrude from a top surface of a remaining portion of the insulating layer.

In accordance with some embodiments, a method for forming a semiconductor device structure is provided. The method includes forming a semiconductor protruding structure over a substrate and forming an insulating layer along sidewalls of the semiconductor protruding structure. The method also includes forming a dielectric structure over the substrate and performing a planarization process. As a result, topmost surfaces of the semiconductor protruding structure, the insulating layer, and the dielectric structure are substantially level with each other. The method further includes forming a protective layer to cover the topmost surface of the dielectric structure. In addition, the method includes partially removing the insulating layer after the protective layer is formed such that the semiconductor protruding structure and the dielectric structure protrude from a top surface of a remaining portion of the insulating layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:
   forming a semiconductor protruding structure over a substrate;
   forming an insulating layer along sidewalls and a top of the semiconductor protruding structure;
   forming a dielectric layer over the insulating layer;
   planarizing the dielectric layer and the insulating layer to expose the top of the semiconductor protruding structure, wherein a remaining portion of the dielectric layer forms a dielectric structure;
   forming a protective element to cover a top of the dielectric structure; and
   recessing the insulating layer after the protective element is formed such that the semiconductor protruding structure and the dielectric structure protrude from a top surface of a remaining portion of the insulating layer.

2. The method for forming a semiconductor device structure as claimed in claim 1, further comprising:
   forming a protective layer to cover the dielectric structure, the semiconductor protruding structure, and the insulating layer, wherein a first portion of the protective layer directly above the dielectric structure forms the protective element.

3. The method for forming a semiconductor device structure as claimed in claim 2, wherein the protective layer has a second portion directly above the insulating layer, the protective layer has a third portion directly above the semiconductor protruding structure, the first portion is thicker than the second portion, and the first portion is thicker than the third portion.

4. The method for forming a semiconductor device structure as claimed in claim 2, wherein the protective layer is formed using an atomic layer deposition process.

5. The method for forming a semiconductor device structure as claimed in claim 1, wherein the protective element is consumed during the recessing of the insulating layer.

6. The method for forming a semiconductor device structure as claimed in claim 1, further comprising:
   depositing a protective material over the top of the dielectric structure to form the protective element, wherein the protective material is substantially not deposited on surfaces of the semiconductor protruding structure and the insulating layer.

7. The method for forming a semiconductor device structure as claimed in claim 1, wherein the formation of the protective element does not involve any photolithography process.

8. The method for forming a semiconductor device structure as claimed in claim 1, further comprising:
   forming an interfacial layer over the insulating layer before the dielectric layer is formed, wherein the interfacial layer extends along sidewalls of the dielectric structure.

9. The method for forming a semiconductor device structure as claimed in claim 8, further comprising:
   partially removing the interfacial layer such that a topmost surface of the interfacial layer is substantially level with the top surface of the remaining portion of the insulating layer.

10. The method for forming a semiconductor device structure as claimed in claim 9, wherein the dielectric layer has a first atomic concentration of carbon, the interfacial layer has a second atomic concentration of carbon, and the first atomic concentration of carbon is greater than the second atomic concentration of carbon.

11. A method for forming a semiconductor device structure, comprising:
   forming a semiconductor protruding structure over a substrate;
   surrounding the semiconductor protruding structure with an insulating layer;
   forming a dielectric layer over the insulating layer;
   partially removing the dielectric layer and insulating layer using a planarization process such that topmost surfaces of the semiconductor protruding structure, the insulating layer, and the dielectric layer are substantially level with each other;
   forming a protective layer to cover the topmost surfaces of the dielectric layer; and
   recessing the insulating layer after the protective layer is formed such that the semiconductor protruding structure and a portion of the dielectric layer protrude from a top surface of a remaining portion of the insulating layer.

12. The method for forming a semiconductor device structure as claimed in claim 11, wherein the protective layer substantially does not cover the topmost surfaces of the semiconductor protruding structure and the insulating layer.

13. The method for forming a semiconductor device structure as claimed in claim 11, wherein each of portions of the protective layer directly above the topmost surfaces of the semiconductor protruding structure and the insulating layer is thinner than each of portions of the protective layer directly above the topmost surfaces of the dielectric layer.

14. The method for forming a semiconductor device structure as claimed in claim 11, wherein the protective layer is completely consumed during the recessing of the insulating layer.

15. The method for forming a semiconductor device structure as claimed in claim 11, further comprising:
   forming a second dielectric layer over the dielectric layer, wherein the second dielectric layer is also partially removed during the planarization process such that the topmost surfaces of the second dielectric layer are substantially level with the topmost surfaces of the dielectric layer, and the protective layer further covers the topmost surfaces of the second dielectric layer.

16. A method for forming a semiconductor device structure, comprising:
   forming a semiconductor protruding structure over a substrate;
   forming an insulating layer along sidewalls of the semiconductor protruding structure;
   forming a dielectric structure over the substrate;
   performing a planarization process such that topmost surfaces of the semiconductor protruding structure, the insulating layer, and the dielectric structure are substantially level with each other;
   forming a protective layer to cover the topmost surface of the dielectric structure; and
   partially removing the insulating layer after the protective layer is formed such that the semiconductor protruding structure and the dielectric structure protrude from a top surface of a remaining portion of the insulating layer.

17. The method for forming a semiconductor device structure as claimed in claim 16, wherein the protective layer further extends over the topmost surfaces of the insulating layer.

18. The method for forming a semiconductor device structure as claimed in claim 17, wherein a first portion of the protective layer directly above the dielectric structure is thicker than a second portion of the protective layer directly above the insulating layer.

19. The method for forming a semiconductor device structure as claimed in claim 16, wherein the insulating layer is substantially free of nitrogen.

20. The method for forming a semiconductor device structure as claimed in claim 16, wherein the protective layer is completely consumed during the partial removal of the insulating layer.

* * * * *